United States Patent
Hsieh et al.

(10) Patent No.: US 11,094,802 B2
(45) Date of Patent: Aug. 17, 2021

(54) METHOD OF MANUFACTURING A SEMICONDUCTOR DEVICE AND SEMICONDUCTOR DEVICE

(71) Applicant: TAIWAN SEMICONDUCTOR MANUFACTURING CO., LTD., Hsinchu (TW)

(72) Inventors: Chi-Wen Hsieh, Hsinchu (TW); Chien-Ping Hung, Hsinchu (TW); Chi-Kang Chang, New Taipei (TW); Shih-Chi Fu, Hsinchu County (TW); Kuei-Shun Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 71 days.

(21) Appl. No.: 16/507,951

(22) Filed: Jul. 10, 2019

(65) Prior Publication Data

US 2020/0058762 A1 Feb. 20, 2020

Related U.S. Application Data

(60) Provisional application No. 62/719,300, filed on Aug. 17, 2018.

(51) Int. Cl.
*H01L 29/66* (2006.01)
*H01L 29/78* (2006.01)

(52) U.S. Cl.
CPC .... *H01L 29/6681* (2013.01); *H01L 29/66545* (2013.01); *H01L 29/785* (2013.01)

(58) Field of Classification Search
CPC .............. H01L 29/6681; H01L 29/785; H01L 29/66545; H01L 29/66795; H01L 27/0207;
(Continued)

(56) References Cited

U.S. PATENT DOCUMENTS

2012/0278781 A1* 11/2012 Wann ...................... G06F 30/39
716/122
2014/0317581 A1* 10/2014 Chuang ............... H01L 21/0274
716/53
(Continued)

FOREIGN PATENT DOCUMENTS

TW 201312753 A 3/2013
TW 201413957 A 4/2014
(Continued)

*Primary Examiner* — Marcos D. Pizarro
*Assistant Examiner* — Sue Tang
(74) *Attorney, Agent, or Firm* — McDermott Will & Emery LLP

(57) ABSTRACT

In a method of manufacturing a semiconductor device, a layout is prepared. The layout includes active region patterns, each of the active region patterns corresponding to one or two fin structures, first fin cut patterns and second fin cut patterns. At least one pattern selected from the group consisting of the first fin cut patterns and the second fin cut patterns has a non-rectangular shape. The layout is modified by adding one or more dummy active region patterns and by changing the at least one pattern to be a rectangular pattern. Base fin structures are formed according to a modified layout including the active region patterns and the dummy active region patterns. Part of the base fin structures is removed according to one of a modified layout of the first fin cut patterns and a modified layout of the second fin cut patterns.

20 Claims, 18 Drawing Sheets

(58) Field of Classification Search
CPC ......... H01L 27/0886; H01L 21/823431; H01L 29/7853
See application file for complete search history.

(56) References Cited

U.S. PATENT DOCUMENTS

| | | | |
|---|---|---|---|
| 2015/0161314 A1* | 6/2015 | Kim | ........................ G06F 30/39 716/102 |
| 2015/0243667 A1 | 8/2015 | Liaw | |
| 2016/0027778 A1* | 1/2016 | Moriwaki | ........... H01L 29/0692 257/401 |
| 2017/0323894 A1 | 11/2017 | Yeh et al. | |
| 2018/0006038 A1 | 1/2018 | Yeh et al. | |

FOREIGN PATENT DOCUMENTS

| | | |
|---|---|---|
| TW | 201637099 A | 10/2016 |
| TW | 201732936 A | 9/2017 |

\* cited by examiner

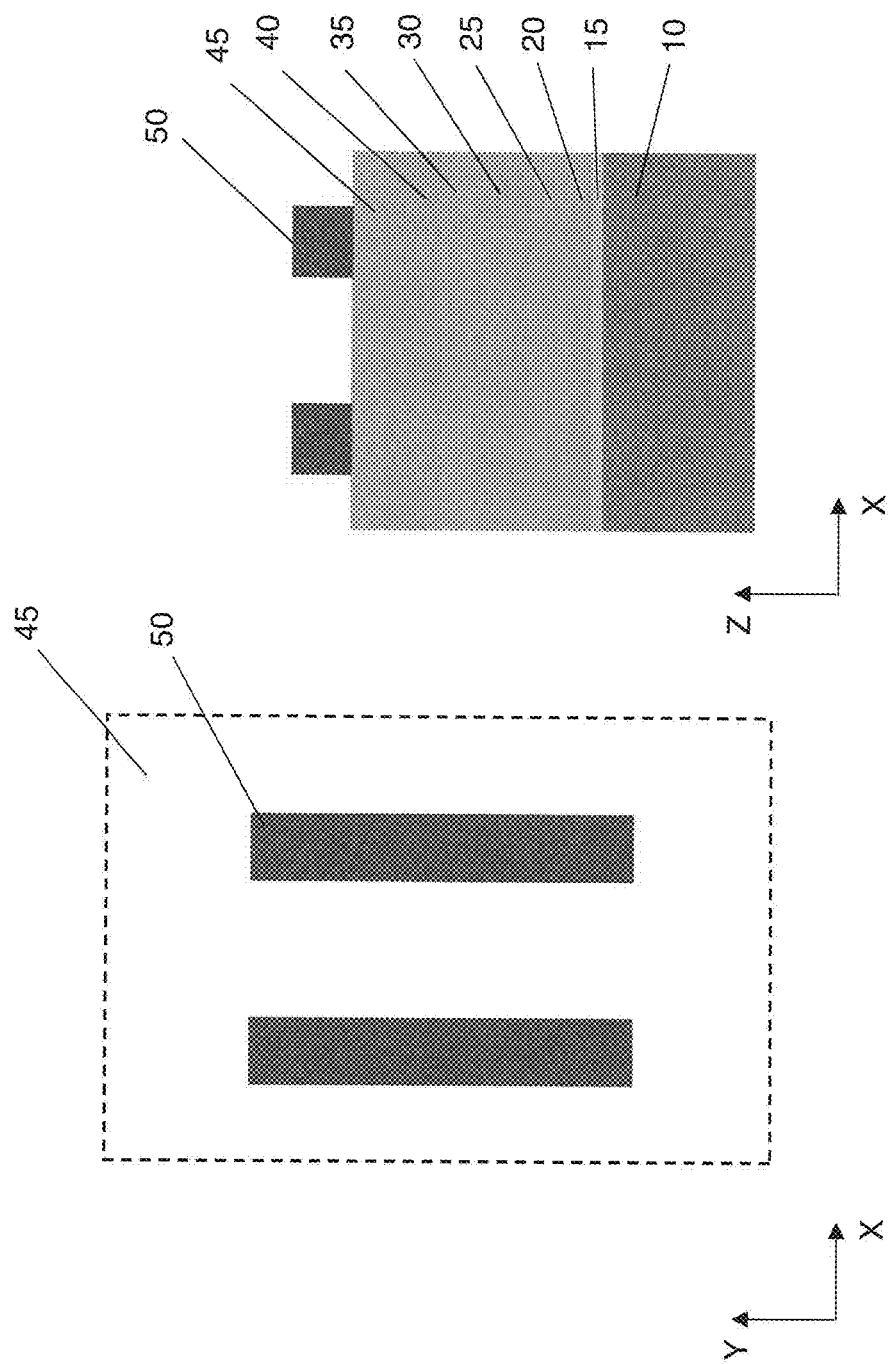

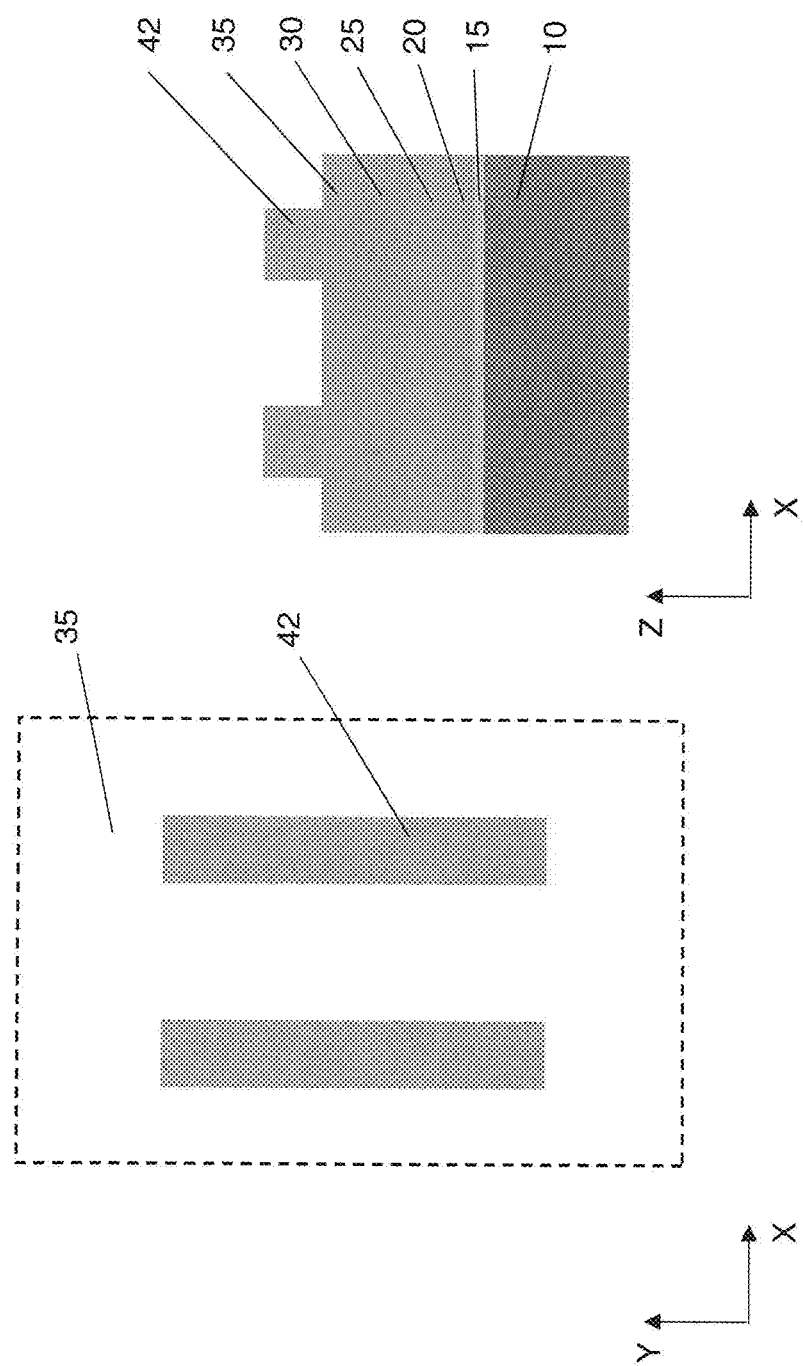

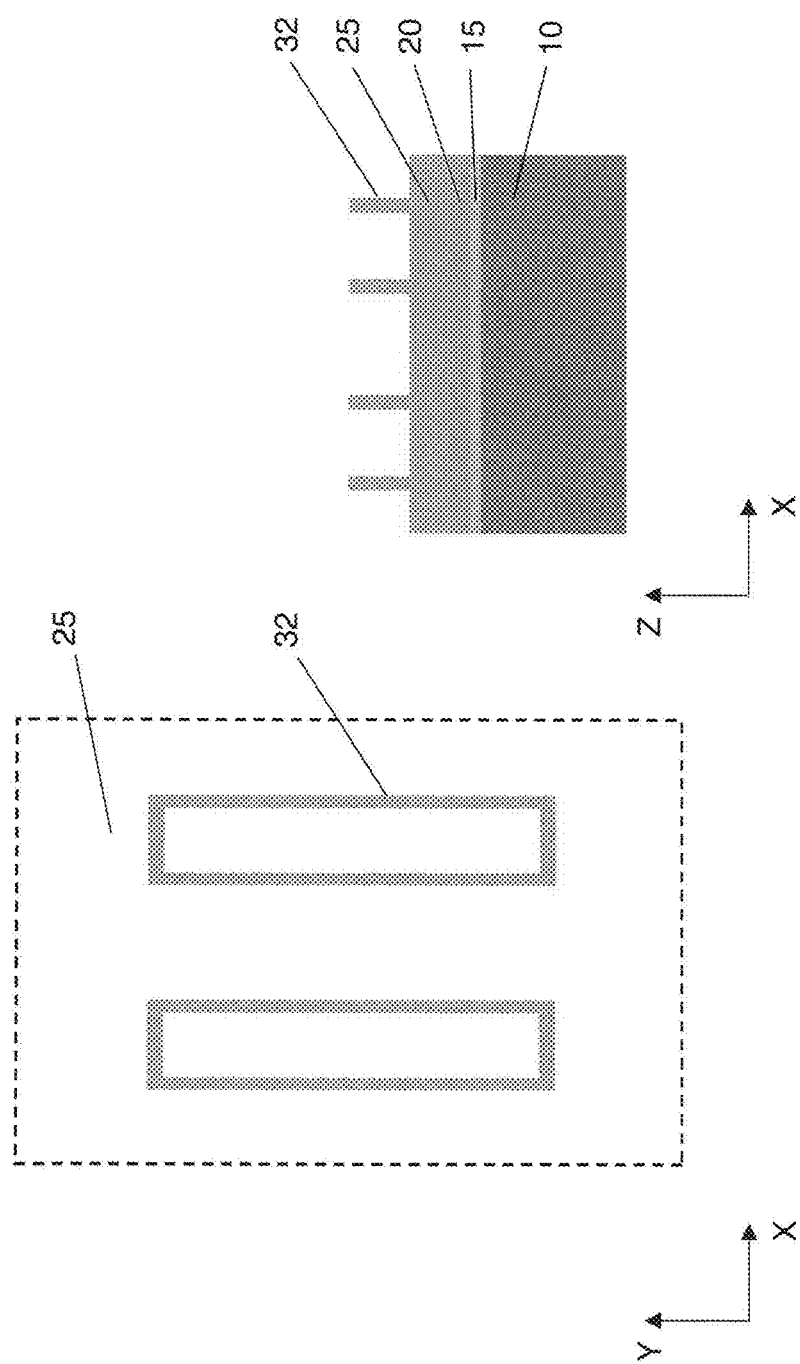

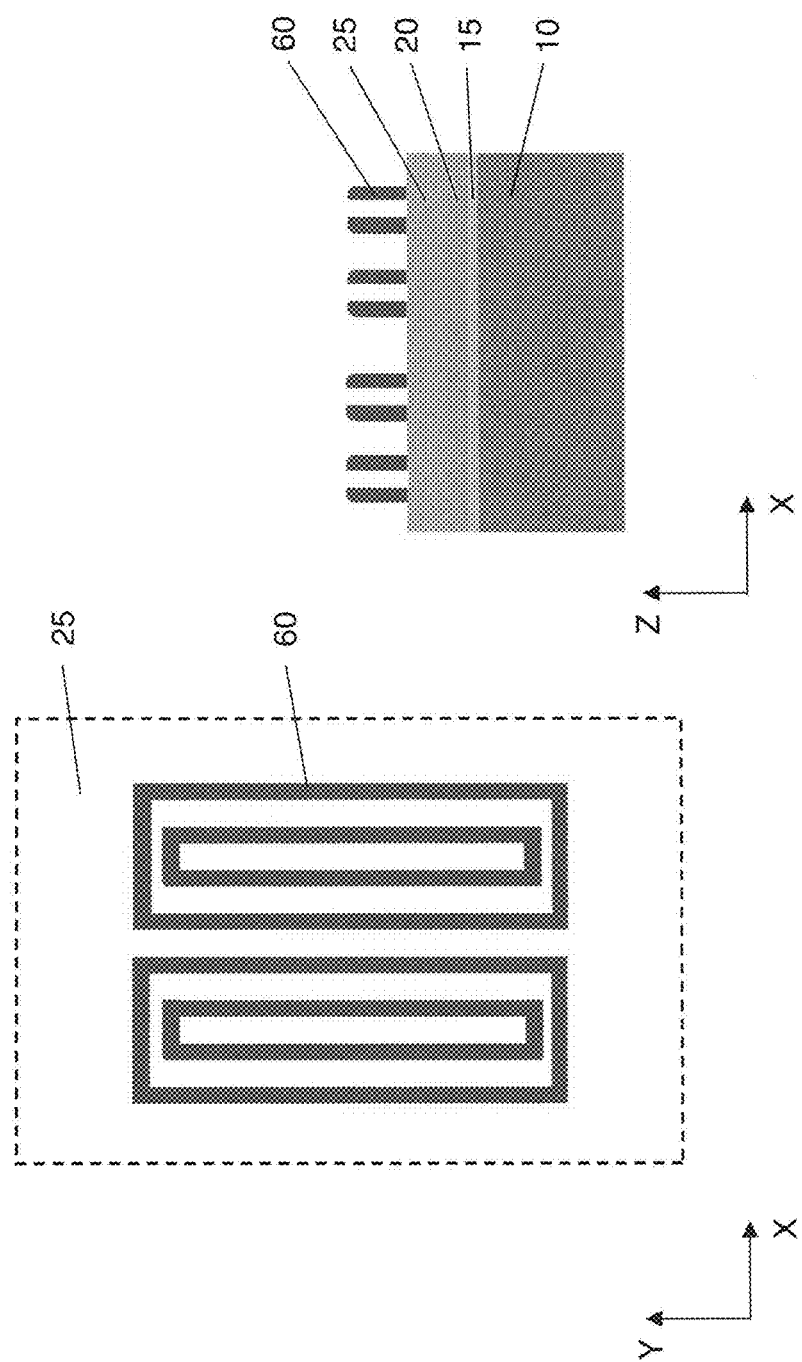

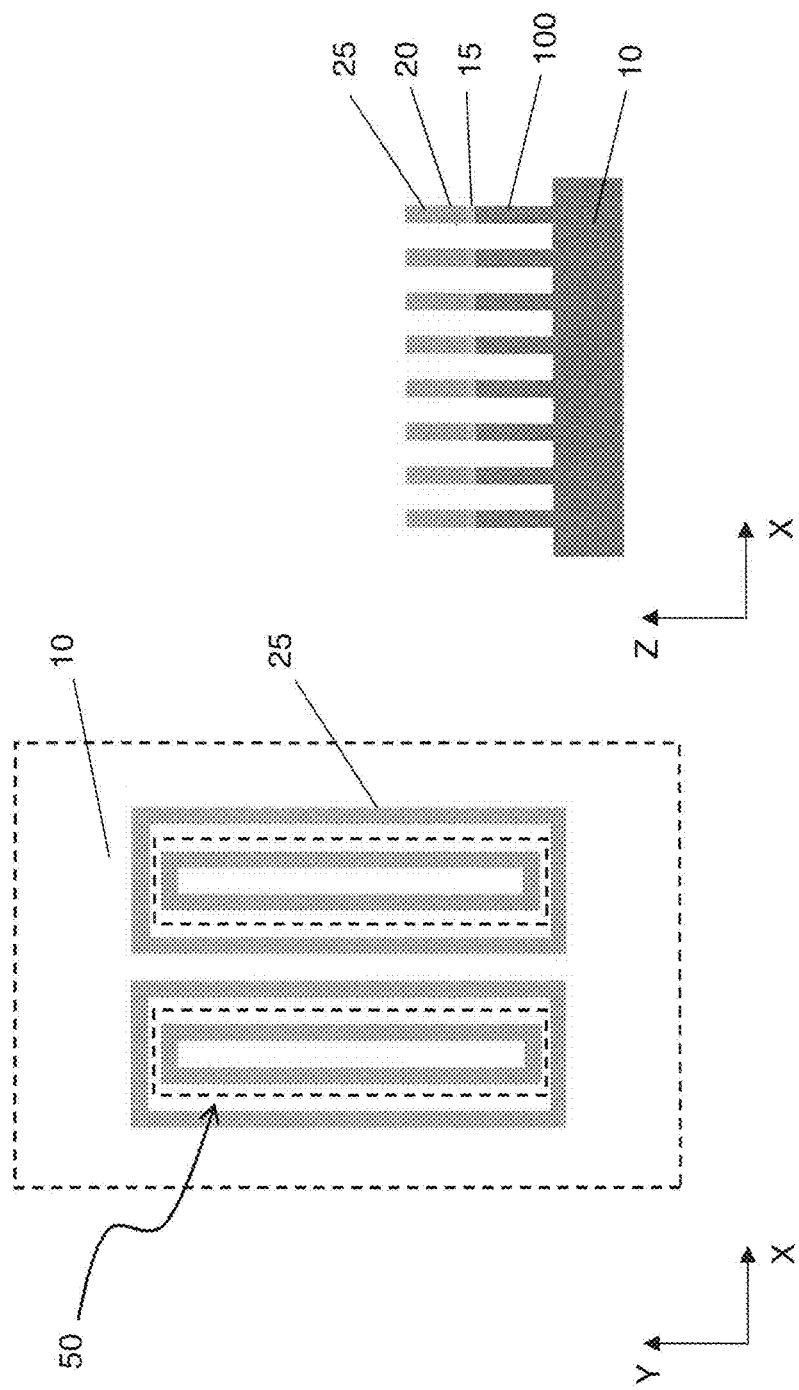

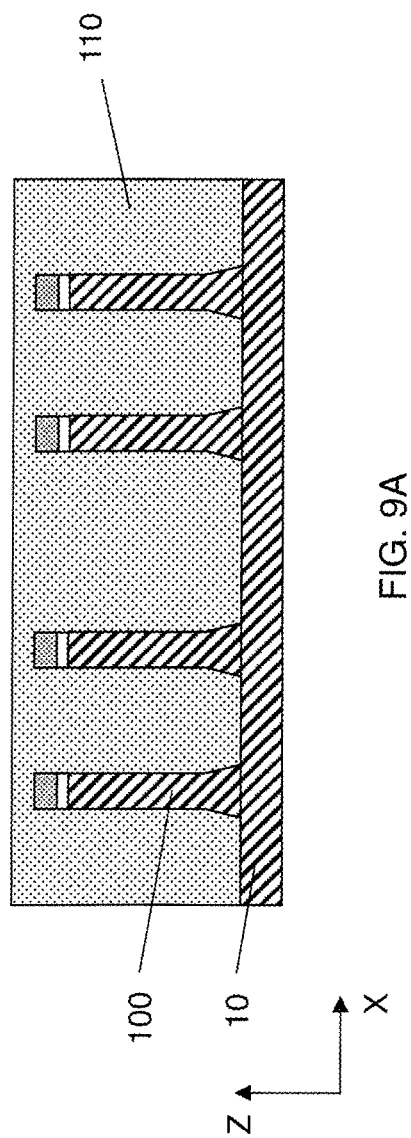
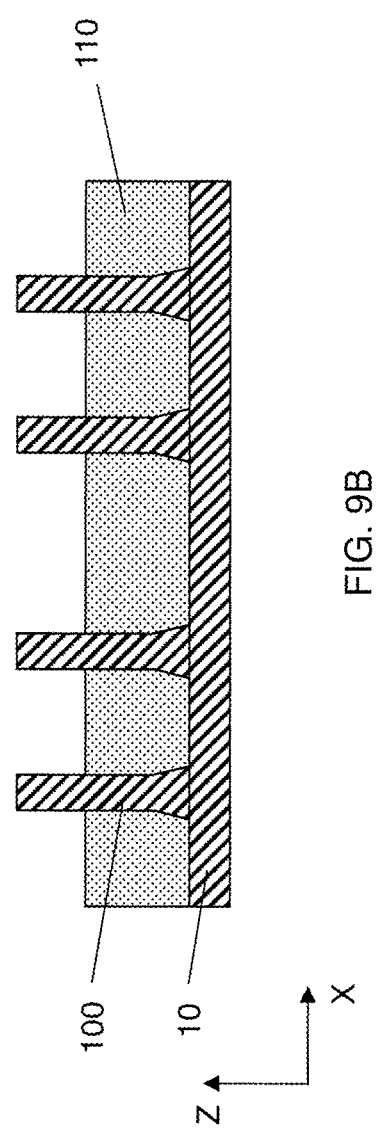
FIG. 9A
FIG. 9B

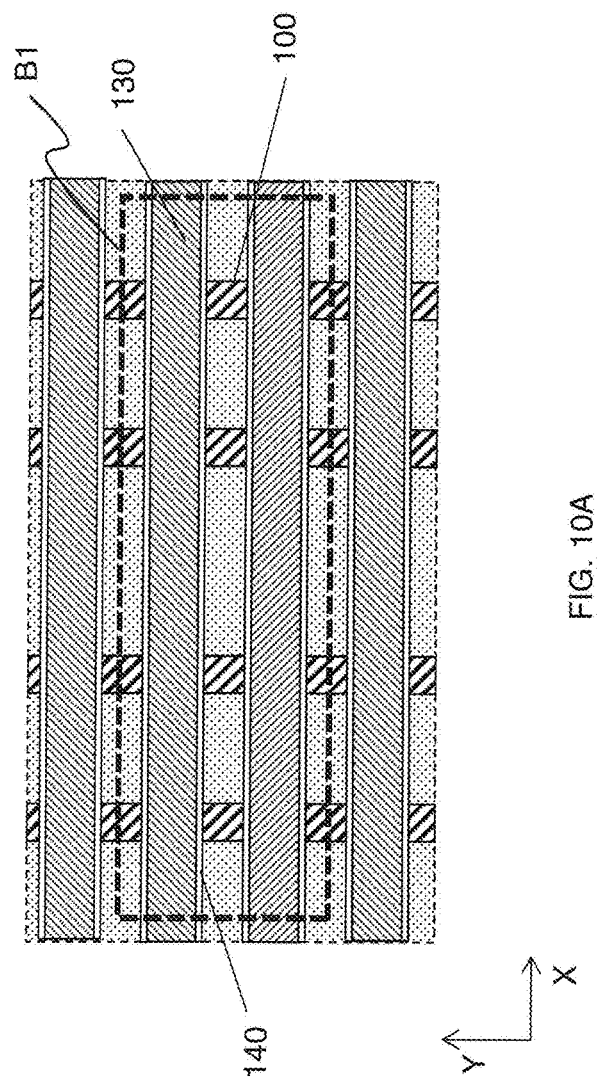
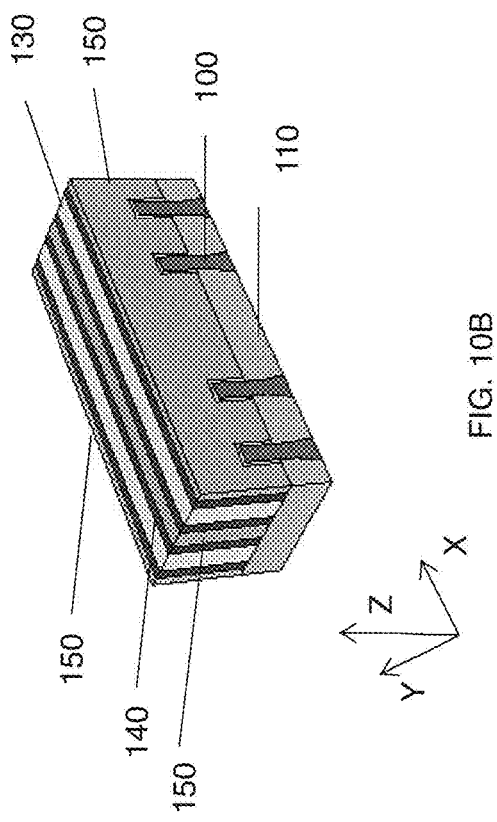
FIG. 10A
FIG. 10B

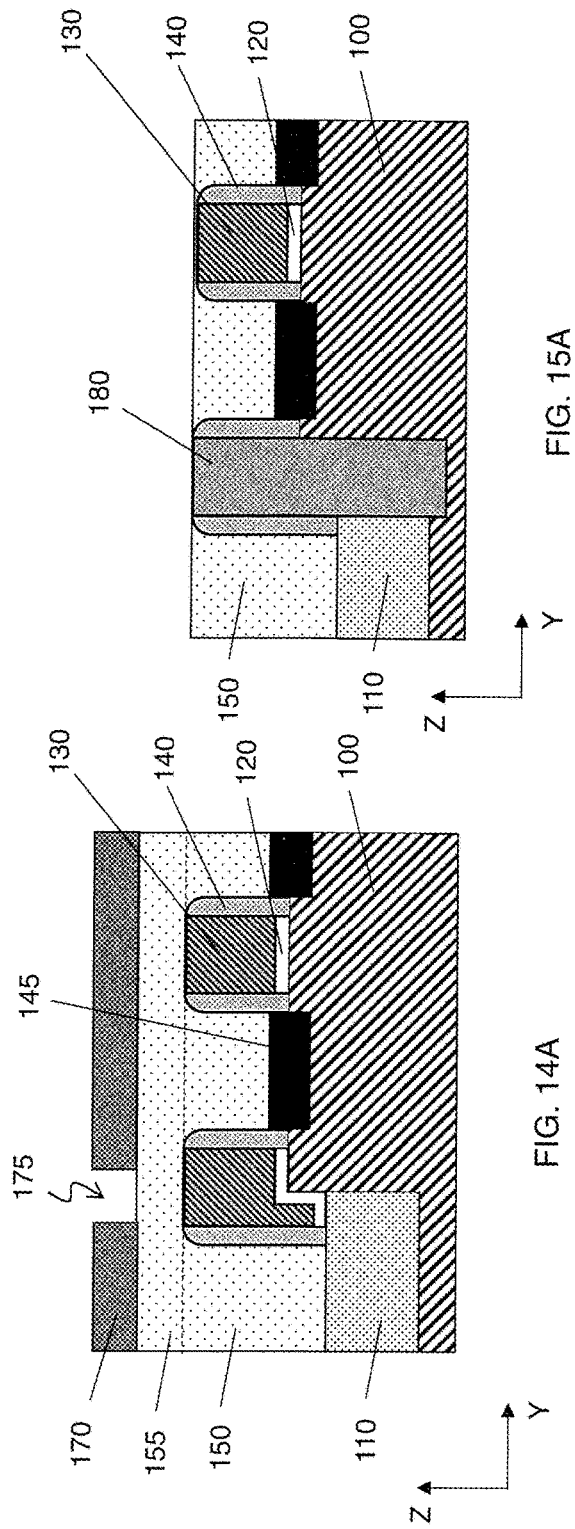
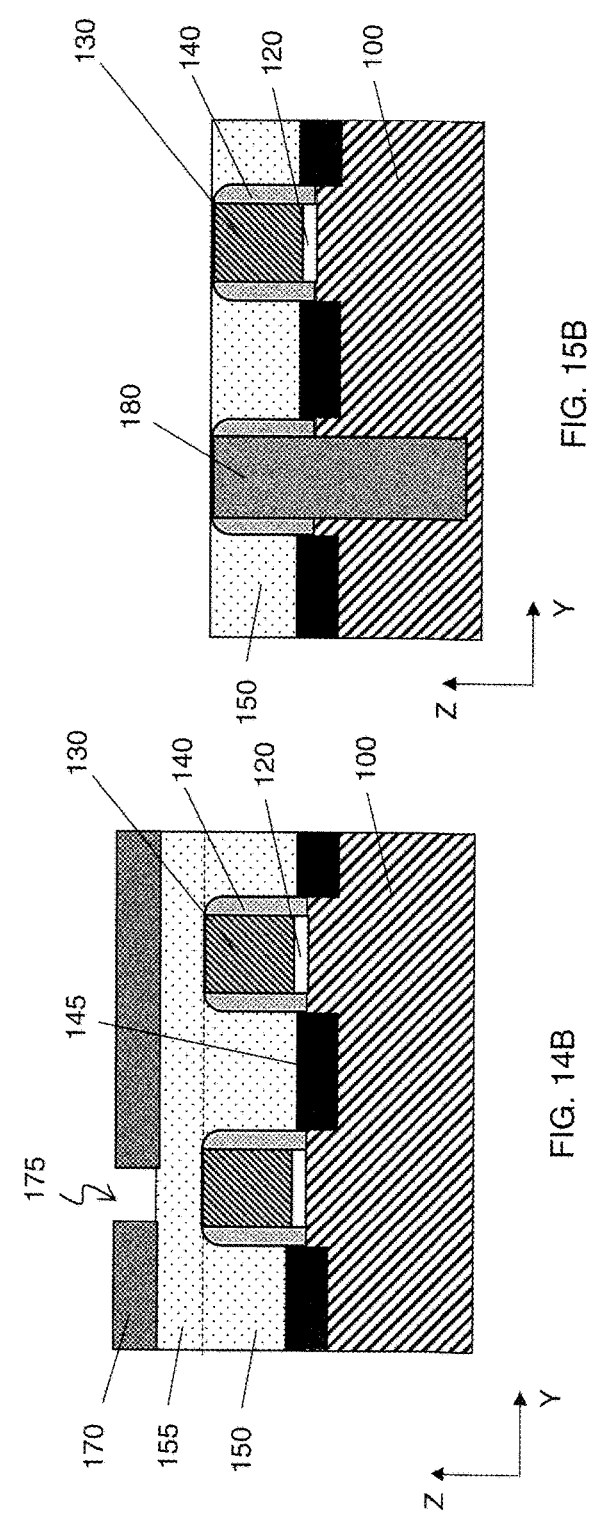
FIG. 14A
FIG. 14B
FIG. 15A
FIG. 15B

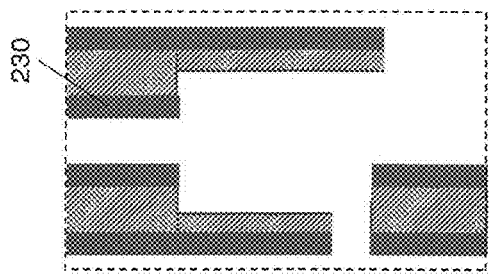
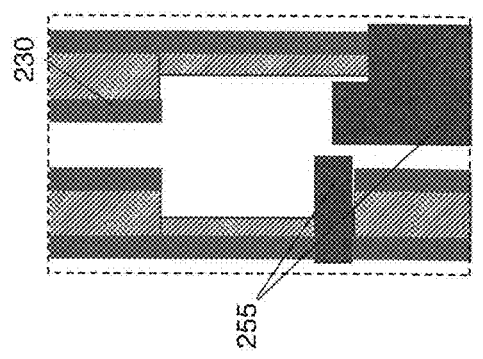
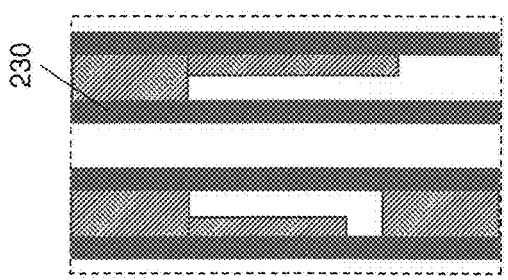
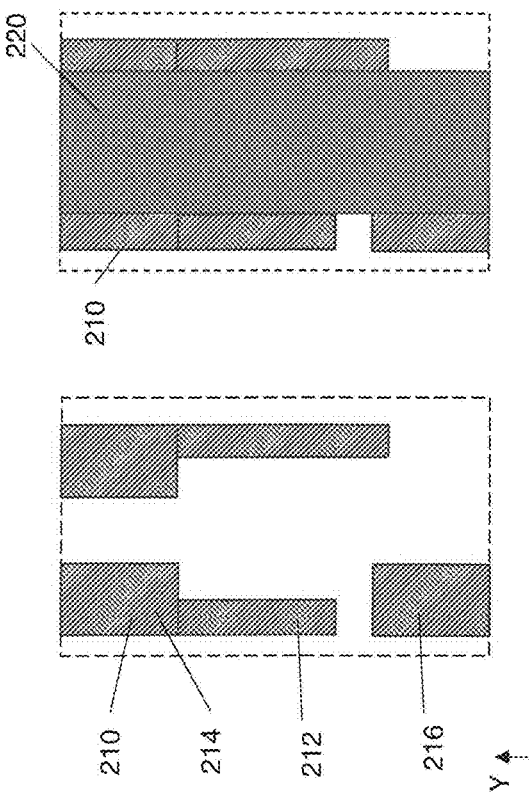
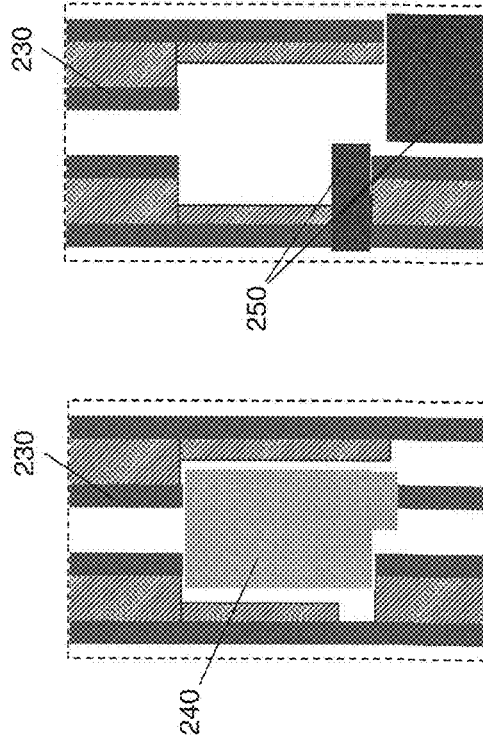

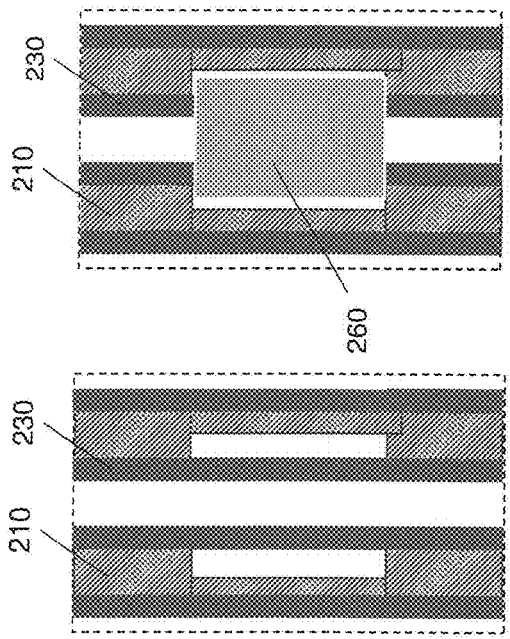
FIG. 27
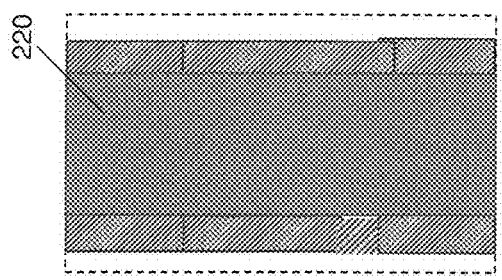
FIG. 26
FIG. 25
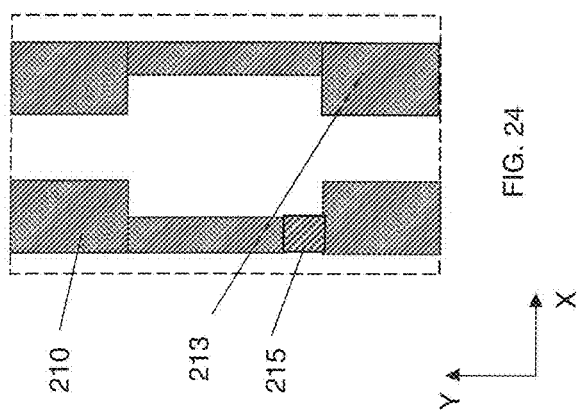
FIG. 24
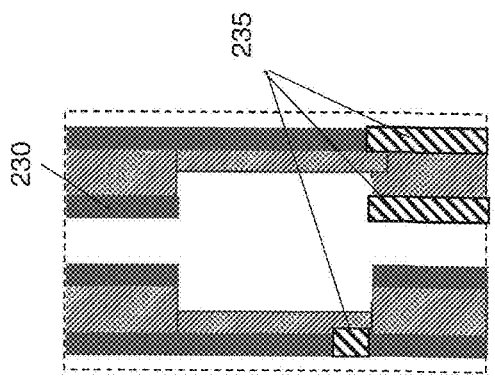
FIG. 28

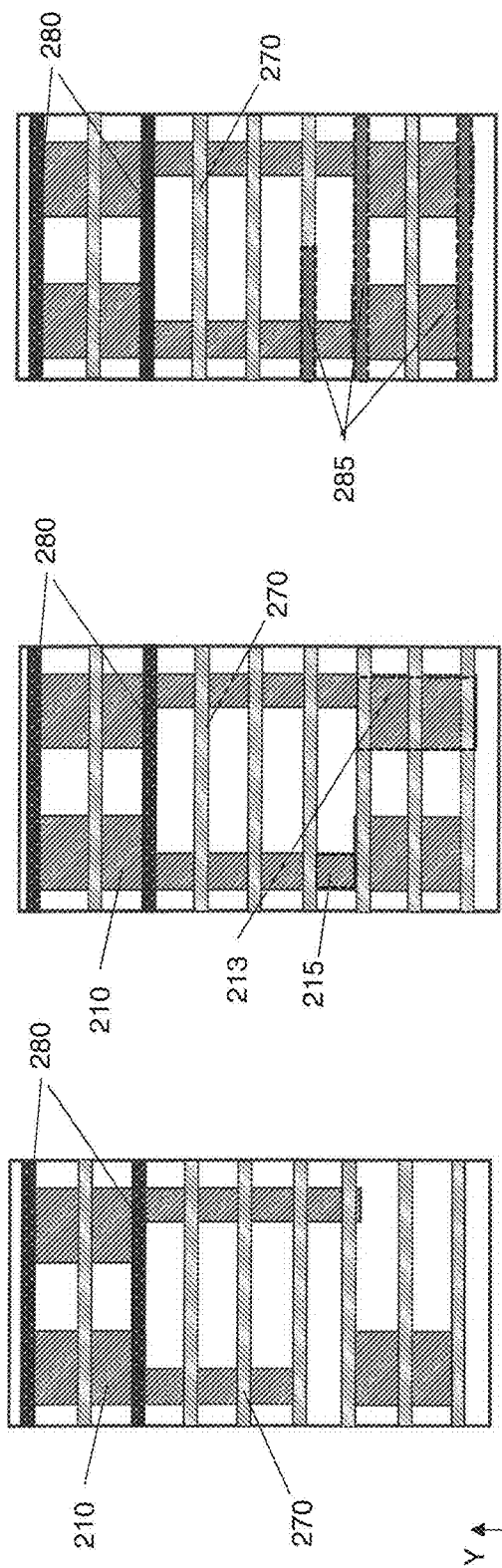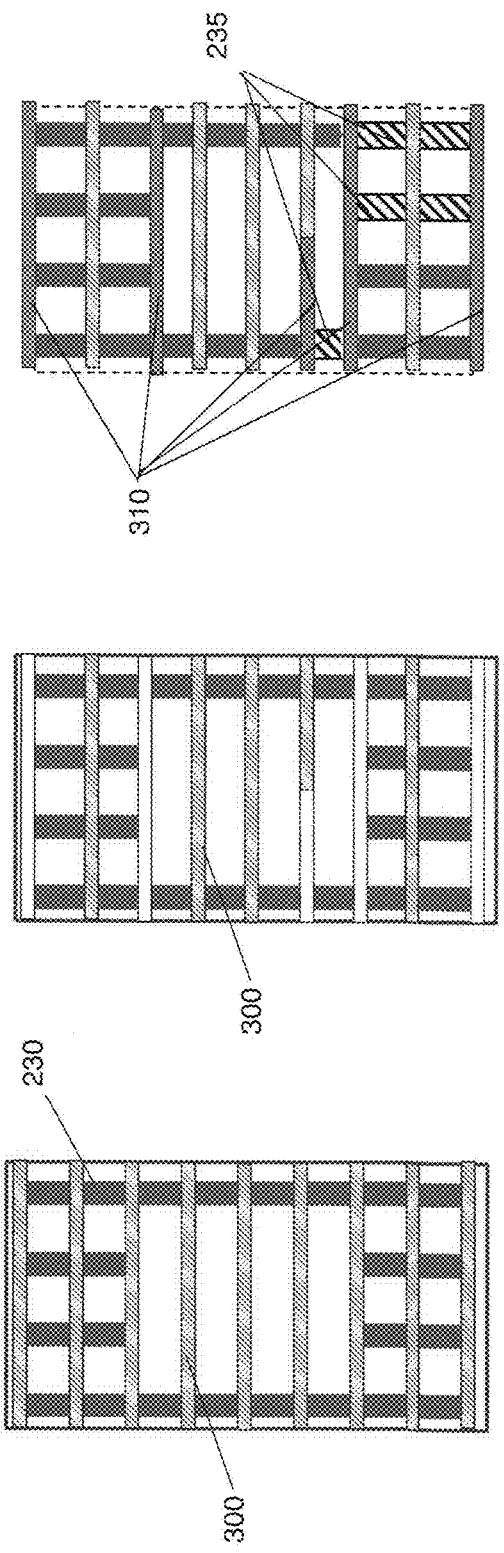

METHOD OF MANUFACTURING A SEMICONDUCTOR DEVICE AND SEMICONDUCTOR DEVICE

RELATED APPLICATION

This application claims priority to U.S. Provisional Patent Application No. 62/719,300 filed Aug. 17, 2018, the entire disclosure of which is incorporated herein by reference.

BACKGROUND

Traditional planar thin film devices provide superior performance with low power consumption. To enhance the device controllability and reduce the substrate surface area occupied by the planar devices, the semiconductor industry has progressed into nanometer technology process nodes in pursuit of higher device density, higher performance, and lower costs. Challenges from both fabrication and design issues have resulted in the development of three-dimensional designs, such as a multi-gate field effect transistor (FET), including a fin field effect transistor (FinFET) and a gate-all-around (GAA) field effect transistor (FET). In a FinFET, a gate electrode is adjacent to three side surfaces of a channel region with a gate dielectric layer interposed therebetween. Because the gate structure surrounds (wraps) the fin on three surfaces (i.e., the top surface and the opposite lateral surfaces), the transistor essentially has three gates controlling (one gate at each of the top surface and the opposite lateral surfaces) the current through the fin or channel region. The fourth side of the bottom of the channel is far away from the gate electrode and thus is not under close gate control. In contrast, in a GAA FET, all side surfaces (i.e. the top surface, the opposite lateral surfaces, and the bottom surface) of the channel region are surrounded by the gate electrode, which allows for fuller depletion in the channel region and results in reduced short-channel effect due to steeper sub-threshold current swing (SS) and smaller drain induced barrier lowering (DIBL). As transistor dimensions are continually scaled down to sub 10-15 nm technology nodes, further improvements of the FinFETs and/or GAA FETs are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1A shows a top (plan) view and FIG. 1B shows a cross sectional view of one of the various stages of a sequential manufacturing operation of a semiconductor device according to an embodiment of the present disclosure.

FIG. 2A shows a top (plan) view and FIG. 2B shows a cross sectional view of one of the various stages of a sequential manufacturing operation of a semiconductor device according to an embodiment of the present disclosure.

FIG. 4A shows a top (plan) view and FIG. 4B shows a cross sectional view of one of the various stages of a sequential manufacturing operation of a semiconductor device according to an embodiment of the present disclosure.

FIG. 5A shows a top (plan) view and FIG. 5B shows a cross sectional view of one of the various stages of a sequential manufacturing operation of a semiconductor device according to an embodiment of the present disclosure.

FIG. 6A shows a top (plan) view and FIG. 6B shows a cross sectional view of one of the various stages of a sequential manufacturing operation of a semiconductor device according to an embodiment of the present disclosure.

FIG. 9A shows a cross sectional view of one of the various stages of a sequential manufacturing operation of a semiconductor device according to an embodiment of the present disclosure.

FIG. 9B shows a cross sectional view of one of the various stages of a sequential manufacturing operation of a semiconductor device according to an embodiment of the present disclosure.

FIG. 10A shows a top view and FIG. 10B shows a perspective view of one of the various stages of a sequential manufacturing operation of a semiconductor device according to an embodiment of the present disclosure.

FIGS. 14A and 14B show cross sectional views of one of the Various stages of a sequential manufacturing operation of a semiconductor device according to an embodiment of the present disclosure.

FIGS. 15A and 15B show cross sectional views of one of the various stages of a sequential manufacturing operation of a semiconductor device according to an embodiment of the present disclosure.

FIG. 16 shows a layout pattern for active regions according to an embodiment of the present disclosure.

FIG. 17 shows a mandrel (dummy) pattern and the layout pattern for active regions and according to an embodiment of the present disclosure.

FIG. 18 shows fin structures and the layout pattern for active regions according to an embodiment of the present disclosure.

FIG. 19 shows fin structures after unnecessary portions are removed and the layout pattern for active regions according to an embodiment of the present disclosure.

FIG. 20 shows a first mask pattern to remove part of the fin structures and the layout pattern for active regions according to an embodiment of the present disclosure.

FIG. 21 shows a second mask pattern to remove part of the fin structures and the layout pattern for active regions according to an embodiment of the present disclosure.

FIG. 22 shows a first mask pattern to remove part of the fin structures and the layout pattern for active regions according to another embodiment of the present disclosure.

FIG. 23 shows a second mask pattern to remove part of the fin structures and the layout pattern for active regions according to another embodiment of the present disclosure.

FIG. 24 shows a layout pattern for active regions after dummy active region patterns are added according to an embodiment of the present disclosure.

FIG. 25 shows a mandrel (dummy) pattern and the layout pattern for active regions and according to an embodiment of the present disclosure.

FIG. 26 shows fin structures and the layout pattern for active regions according to an embodiment of the present disclosure.

FIG. 27 shows a mask pattern to remove part of the fin structures and the layout pattern for active regions according to an embodiment of the present disclosure.

FIG. 28 shows fin structures after unnecessary portions are removed and the layout pattern for active regions according to an embodiment of the present disclosure.

FIG. 29 shows a layout of gate patterns (dummy gate patterns) and a layout pattern for active regions according to an embodiment of the present disclosure.

FIG. 30 shows a layout of gate patterns (dummy gate patterns) and a layout pattern for active regions after dummy active region patterns are added according to an embodiment of the present disclosure.

FIG. 31 shows a layout of gate patterns after additional fin-end gate cut patterns are added and a layout pattern for active regions after dummy active region patterns are added according to an embodiment of the present disclosure.

FIG. 32 shows a top view of one of the various stages of a sequential manufacturing operation of a semiconductor device according to an embodiment of the present disclosure.

FIG. 33 shows a top view of one of the various stages of a sequential manufacturing operation of a semiconductor device according to an embodiment of the present disclosure.

FIG. 34 shows a top view of one of the various stages of a sequential manufacturing operation of a semiconductor device according to an embodiment of the present disclosure.

DETAILED DESCRIPTION

Figures 3A, 3B:
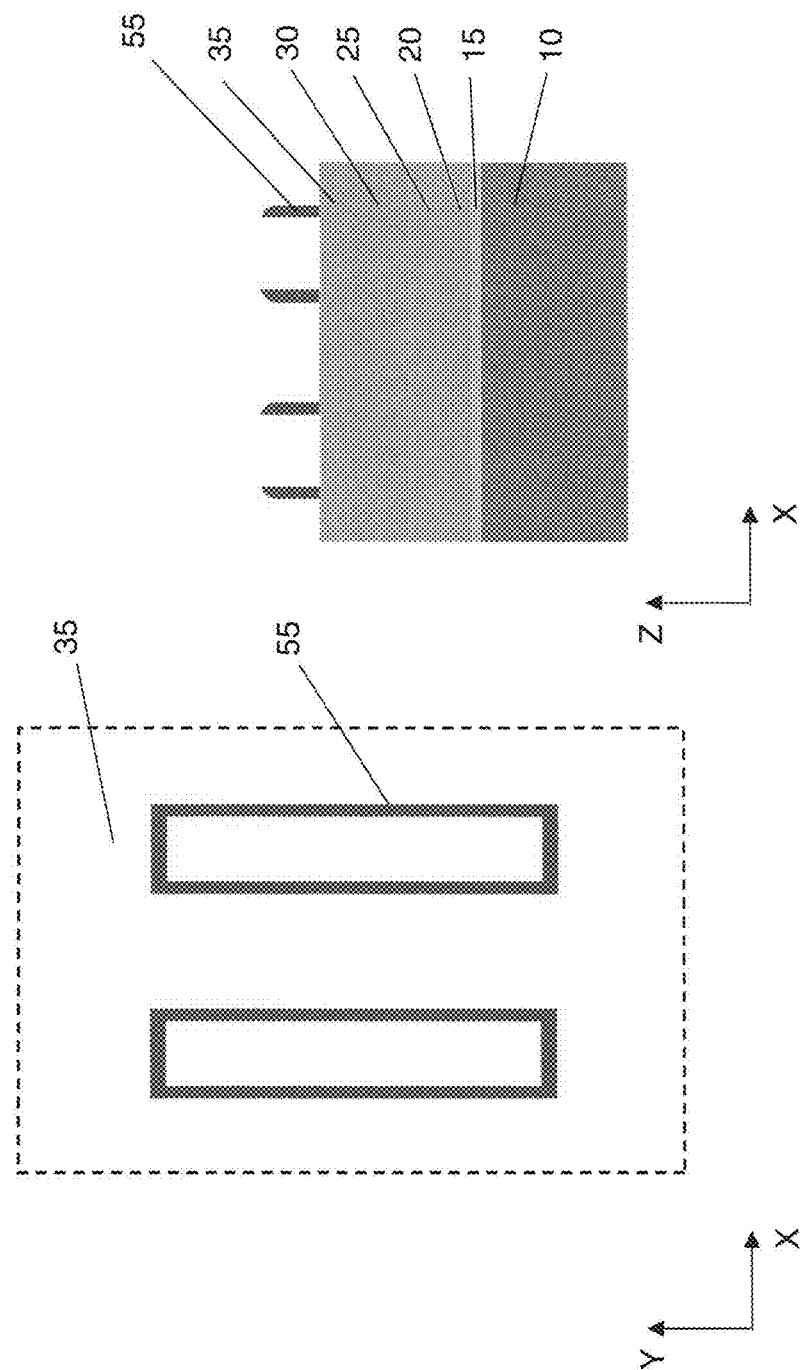
FIG. 3A shows a top (plan) view and FIG. 3B shows a cross sectional view of one of the various stages of a sequential manufacturing operation of a semiconductor device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In this disclosure, a source/drain refers to a source and/or a drain. It is noted that in the present disclosure, a source and a drain are interchangeably used and the structures thereof are substantially the same.

FIGS. 1A-8B show a sequential operation to manufacture fin structures according to an embodiment of the present disclosure. It is understood that additional operations can be provided before, during, and after processes shown by these figures, and some of the operations described below can be replaced or eliminated, for additional embodiments of the method. The order of the operations/processes may be interchangeable. The fin structure is subsequently used as a channel region and a source/drain region of a FinFET. In some embodiments, one or more fin structures are referred to as an active region.

FIG. 1A shows a top (plan) view and FIG. 1B shows a cross sectional view of one of the various stages of the sequential manufacturing operation of fin structures. As shown in FIGS. 1A and 1B, one or more mandrel patterns 50 (dummy or sacrificial pattern) is formed over stacked layers formed on a substrate 10. In some embodiments, the mandrel patterns 50 are made of photo resist.

The substrate 10 is, for example, a p-type silicon substrate with an impurity concentration in a range from about $1\times10^{15}$ cm$^{-3}$ and about $5\times10^{15}$ cm$^{-3}$. In other embodiments, The substrate 10 is an n-type silicon substrate with an impurity concentration in a range from about $1\times10^{15}$ cm$^{-3}$ and about $5\times10^{15}$ cm$^{-3}$.

Alternatively, the substrate 10 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The stacked layer includes, from the side closer to the substrate, a first layer 15, a second layer 20, a first hard mask layer 25, a first mandrel layer 30, a second hard mask layer 35, a second mandrel layer 40 and a third hard mask layer 45 in some embodiments. Materials in the stacked layer are different from adjacent layers to ensure a sufficient etching selectivity.

In some embodiments, the first layer 15 and the second layer 20 include one more layers made of dielectric materials, such as $SiO_2$, SiN, SiON, SiCN or SiOCN. In certain embodiments, the first layer 15 is made of silicon oxide. In certain embodiments, the second layer 20 is made of silicon nitride based material, such as SiN and SiON.

In some embodiments, each of the first to third hard mask layers 25, 35 and 45 includes one more layers made of dielectric materials, such as $SiO_2$, SiN, SiON, SiCN, SiOCN, aluminum oxide, hafnium oxide, titanium oxide and zirconium oxide. In other embodiments, metal nitride, such as TiN or TaN, is used for the hard mask layers.

In some embodiments, each of the first and second mandrel layers 30 and 40 includes one or more layers of polycrystalline or amorphous of silicon, silicon germanium or germanium. In other embodiments, the mandrel layers are made of organic material.

Each of the stacked layers layer may be formed by a physical vapor deposition (PVD), such as sputtering method, a chemical vapor deposition (CVD) including plasma-enhanced chemical vapor deposition (PECVD), an atmospheric pressure chemical vapor deposition (APCVD), a low-pressure CVD (LPCVD), a high density plasma CVD (HDPCVD), atomic layer deposition (ALD), and/or other suitable film forming processes.

FIG. 2A shows a top (plan) view and FIG. 2B shows a cross sectional view of one of the various stages of the sequential manufacturing operation of fin structures. The third hard mask layer 45 is patterned by using the photo resist mandrel pattern 50 as an etching mask. Further, by using the patterned third hard mask layer 45 as an etching mask, the second mandrel layer 40 is patterned and the patterned third hard mask layer 45 is subsequently removed to form a first mandrel pattern 42, as shown in FIGS. 2A and 2B.

FIG. 3A shows a top (plan) view and FIG. 3B shows a cross sectional view of one of the various stages of the sequential manufacturing operation of fin structures. After the first mandrel pattern 42 is formed, a blanket layer of dielectric material, such as $SiO_2$, SiN, SiON, SiCN or SiOCN, is formed over the first mandrel pattern 42.

Next, anisotropic etching is performed on the blanket layer, thereby forming sidewall spacers 55 around the first mandrel pattern 42. Then, the first mandrel pattern 42 is removed by a suitable etching operation, thereby obtaining a first sidewall pattern 55, as shown in FIGS. 3A and 3B. By adjusting the thickness of the blanket layer, the width of the first sidewall pattern 55 can be adjusted.

FIG. 4A shows a top (plan) view and FIG. 4B shows a cross sectional view of one of the various stages of the sequential manufacturing operation of fin structures. By using the first sidewall patterns 55 as an etching mask, the second hard mask layer 35 is patterned, and further, by using the patterned second hard mask layer 35 as an etching mask, the first mandrel layer 30 is patterned and the patterned second hard mask layer 35 is subsequently removed to form a second mandrel pattern 32, as shown in FIGS. 4A and 4B.

FIG. 5A shows a top (plan) view and FIG. 5B shows a cross sectional view of one of the various stages of the sequential manufacturing operation of fin structures. After the second mandrel pattern 32 is formed, a blanket layer of dielectric material, such as $SiO_2$, SiN, SiON, SiCN or SiOCN, is formed over the second mandrel pattern 32. Next, anisotropic etching is performed on the blanket layer, thereby forming sidewall spacers 60 around the second mandrel pattern 32. Then, the second mandrel pattern 32 is removed by a suitable etching operation, thereby obtaining a second sidewall pattern 60, as shown in FIGS. 5A and 5B. By adjusting the thickness of the blanket layer, the width of the second sidewall pattern 60 can be adjusted.

FIG. 6A shows a top (plan) view and FIG. 6B shows a cross sectional view of one of the various stages of the sequential manufacturing operation of fin structures. By using the second sidewall patterns 60 as an etching mask, the first hard mask layer 25 is patterned, and further, by using the patterned first hard mask layer 25 as an etching mask, the second and first layer 20 and 15 and the substrate 10 are patterned, thereby forming fin structures 100 as shown in FIGS. 6A and 6B.

As shown in FIG. 6A, a pair of ring-shaped (or frame-shaped) fin structures (corresponding to the second sidewall patterns 60) are formed at the location corresponding to a periphery of the mandrel pattern 50. Further, the fin structures include dummy fin structures in some embodiments. Accordingly, in some embodiments of the present disclosure, unnecessary portions of the fin structures are removed.

Figure 7B:
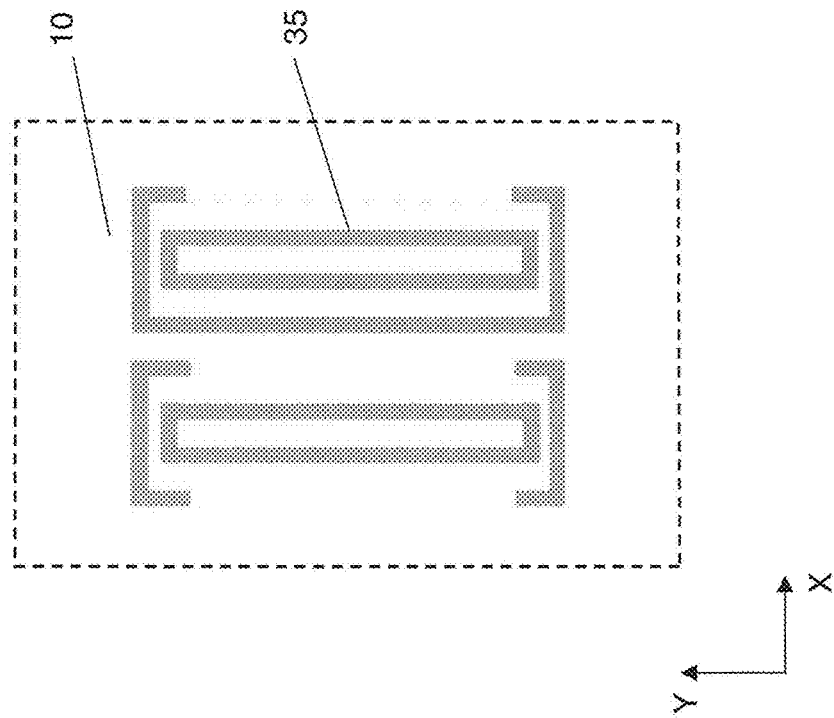
FIG. 7A shows a mask pattern and FIG. 7B shows a top (plan) view of one of the various stages of a sequential manufacturing operation of a semiconductor device according to an embodiment of the present disclosure.
Figure 7A:
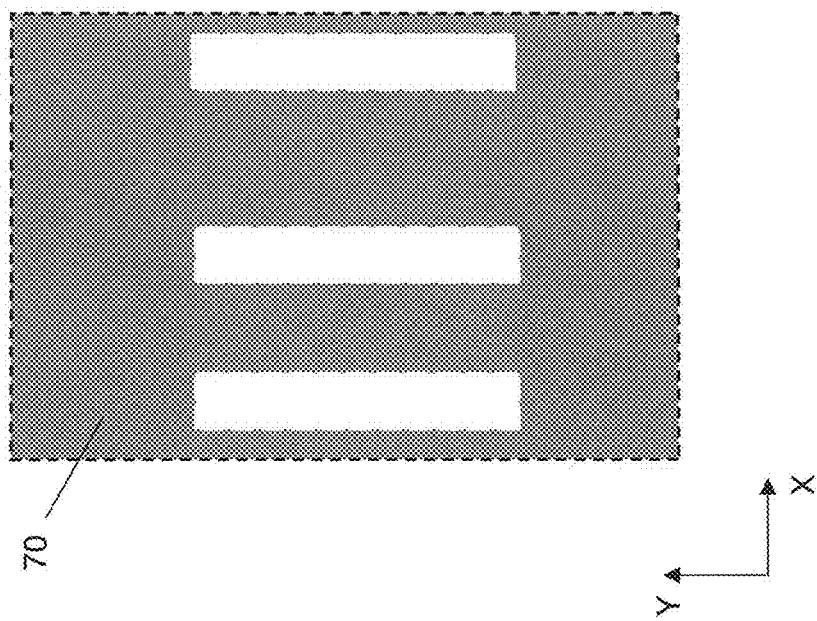
Figure 8B:
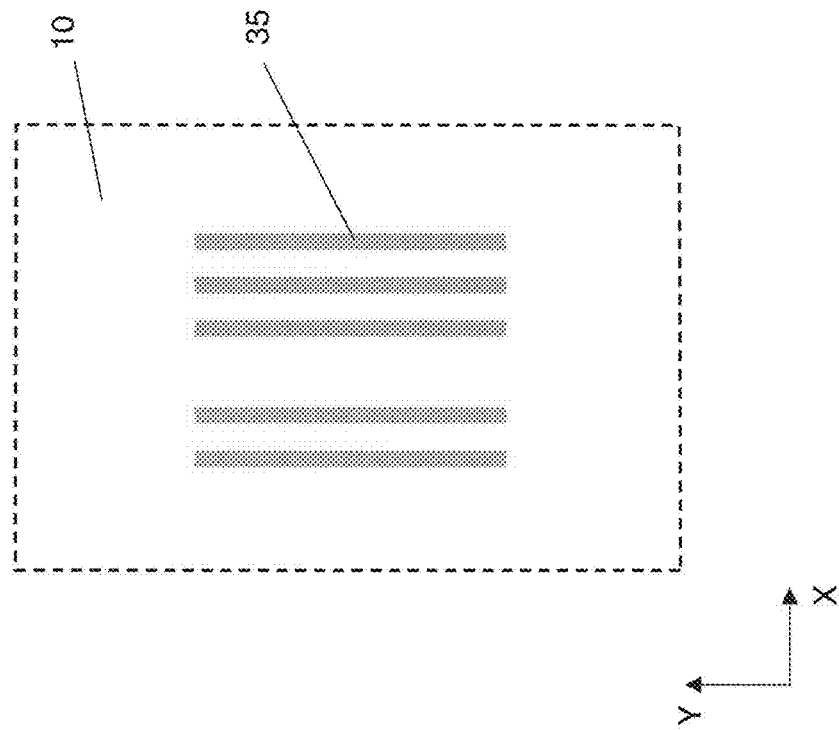
FIG. 8A shows a mask pattern and FIG. 8B shows a top (plan) view of one of the various stages of a sequential manufacturing operation of a semiconductor device according to an embodiment of the present disclosure.
Figure 8A:
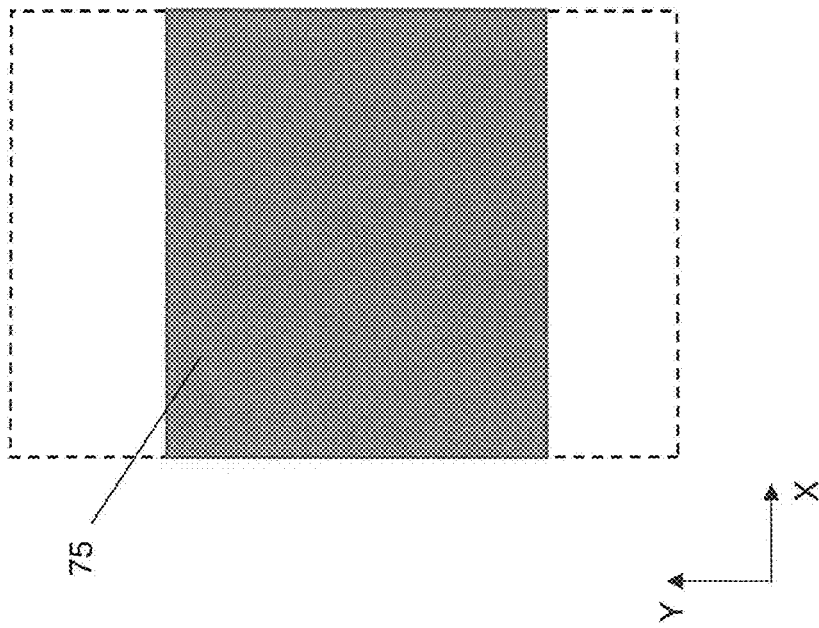

FIG. 7A shows a mask pattern and FIG. 7B shows a top (plan) view of one of the various stages of a sequential manufacturing operation of fin structures. FIG. 8A shows a mask pattern and FIG. 8B shows a top (plan) view of one of the various stages of a sequential manufacturing operation of fin structures. In some embodiments, by using a first mask pattern (first fin-cut pattern or fine fin-cut pattern) 70 shown in FIG. 7A, part of the fin structures is removed. In some embodiments, openings of the first mask pattern 70 extend in the Y direction which is parallel to the direction in which the mandrel pattern 50 and the fin structures extend. Further, in some embodiments, by using a second mask pattern 75 (second fin-cut pattern or coarse fin cut pattern) shown in FIG. 8A, part of the fin structures is removed. In some embodiments, the second mask pattern 75 is designed to cut or remove the fin structure along the X direction. The order of the first and second fin cut operations is interchangeable. It is noted that a first photo mask fabricated by using layout data of the first mask pattern and a second photo mask fabricated by using layout data of the second mask pattern are used for lithography and etching operations to cut the fin structures in some embodiments.

FIGS. 9A-15B show a sequential operation to manufacture a gate structure over fin structures according to an embodiment of the present disclosure. It is understood that additional operations can be provided before, during, and after processes shown by these figures, and some of the operations described below can be replaced or eliminated, for additional embodiments of the method. The order of the operations/processes may be interchangeable. The gate structure is a dummy gate structure, which is subsequently removed and replaced with a metal gate structure, in some embodiments.

After the fin structures 100 are formed as set forth above (FIGS. 1A-8B), an insulating material layer 100 to form an isolation insulating layer is formed over the substrate 10 so as to fully cover the fin structures 100, as shown in FIG. 9A. FIG. 9A shows a cross sectional view.

The insulating material for the isolation insulating layer 100 is made of, for example, silicon dioxide formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, one or more annealing operations are performed. The isolation insulating layer 100 may be SOG, SiO, SiON, SiOCN or fluorine-doped silicate glass (FSG). The isolation insulating layer 100 may be doped with boron and/or phosphorous.

After forming the isolation insulating layer 100, a planarization operation is performed so as to remove upper part of the isolation insulating layer 100 and the first hard mask layer 25, the second layer 20 and the first layer 15. Then, the isolation insulating layer 100 is further removed so that an upper part of the fin structures 100, which is to become a channel region, is exposed, as shown in FIG. 9B. After forming the isolation insulating layer 100, a thermal process, for example, an anneal process, is optionally performed to improve the quality of the isolation insulating layer 100. In certain embodiments, the thermal process is performed by using rapid thermal annealing (RTA) at a temperature in a range from about 900° C. to about 1050° C. for about 1.5 seconds to about 10 seconds in ab inert gas ambient, for example, $N_2$, Ar or He ambient.

After the upper portions of the fin structures 100 are exposed from the isolation insulating layer 100, a dummy gate insulating layer 120 (see, FIG. 11) and a polysilicon layer 130 for a dummy gate electrode are formed over the isolation insulating layer 100 and the exposed fin structures 100. Then one or more patterning operations are performed so as to obtain a dummy gate layer 130 made of poly silicon, as shown in FIGS. 10A and 10B. FIG. 10A shows a top view and FIG. 10B shows a perspective view. The dummy gate insulating layer 120 may be silicon oxide formed by CVD, PVD, ALD, e-beam evaporation, or other suitable process. A thickness of the poly silicon layer is in a range from about 5 to about 100 nm in some embodiments.

After the patterning the poly silicon layer, gate sidewall spaces 140 are also formed at both side faces of the dummy gate electrode 130. The gate sidewall spacers 140 are made of one or more layers of silicon oxide or silicon nitride based materials such as SiN, SiCN, SiON or SiOCN. In one embodiment, silicon nitride is used. After the gate sidewall spacers 140 are formed, an insulating layer (not shown) to be used as a contact-etch stop layer (CESL) is formed over the dummy gate electrode 130 and the gate sidewall spacers 140, in some embodiments. The CESL layer is made of one or more layers of silicon oxide or silicon nitride based materials such as SiN, SiCN, SiON or SiOCN. In one embodiment, silicon nitride is used.

Further, an interlayer dielectric layer (ILD) 150 is formed in spaces between the dummy gate electrodes 130 with the gate sidewall spacers 140. The ILD 150 may include silicon oxide, silicon nitride, silicon oxynitride (SiON), SiOCN, fluorine-doped silicate glass (FSG), or a low-K dielectric material, and may be made of CVD or other suitable process. The insulating material for the isolation insulating layer 110 may be the same as or different from that for the ILD 150. Planarization operations, such as an etch-back process and/or a chemical mechanical polishing (CMP) process, are performed, so as to obtain the structure shown in FIGS. 10A and 10B. FIG. 10B corresponds to the enclosed portion B1 in FIG. 10A. In some embodiments, as shown in FIGS. 10A and 10B, the dummy gate electrodes 130 are formed in a line-and-space arrangement extending in one direction (X direction) with a constant pitch. The dummy gate electrodes 130 cover the channel regions of the Fin FETs formed with the fin structures 100. In other words, the dummy gate electrodes 130 are formed over the channel regions. The fin structures not covered by the gate layers will become source/drain regions by appropriate source/drain fabrication operations.

Figure 11:
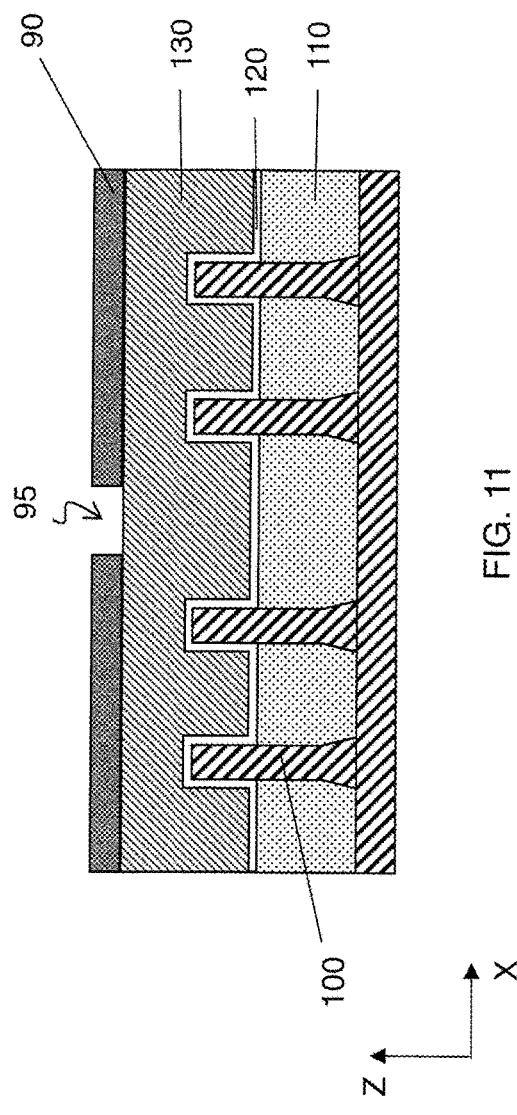
FIG. 11 shows a cross sectional view of one of the various stages of a sequential manufacturing operation of a semiconductor device according to an embodiment of the present disclosure.
Figure 12:
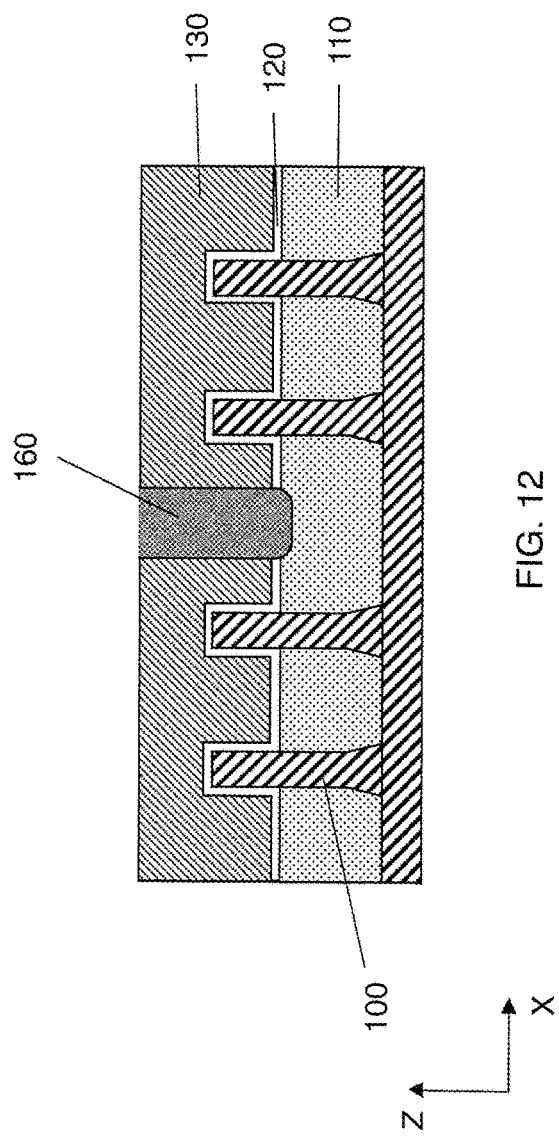
FIG. 12 shows a cross sectional view of one of the various stages of a sequential manufacturing operation of a semiconductor device according to an embodiment of the present disclosure.

Next, as shown in FIG. 11, a mask pattern 90 having an opening 95 is formed over the structure shown in FIGS. 10A and 10B. In some embodiments, one or more dielectric layers are formed over the dummy gate electrode layers 130 before the mask pattern 90 is formed. By using the mask pattern 90 as an etching mask, the dummy gate electrode 130 extending in the X direction is cut or divided into multiple dummy gate electrodes. The mask pattern 90 is a photo resist pattern in some embodiments, and is a hard mask layer in other embodiments. Further, as shown in FIG. 12, the space formed by cutting the dummy gate electrode 130 is filled by a dielectric material 160, such as SiN, SiCN, SiON or SiOCN. One or more layers of different dielectric materials are used as the dielectric material 160 in some embodiments.

Further, in some embodiments, after the dummy gate electrodes are divided and the dielectric layer 160 is formed, source/drain epitaxial layers 145 (see, FIGS. 14A-15B) are formed on or in the source/drain region of the fin structures 100. In other embodiments, the source/drain epitaxial layers 145 are formed before dividing the dummy gate electrodes 130.

Figure 13:
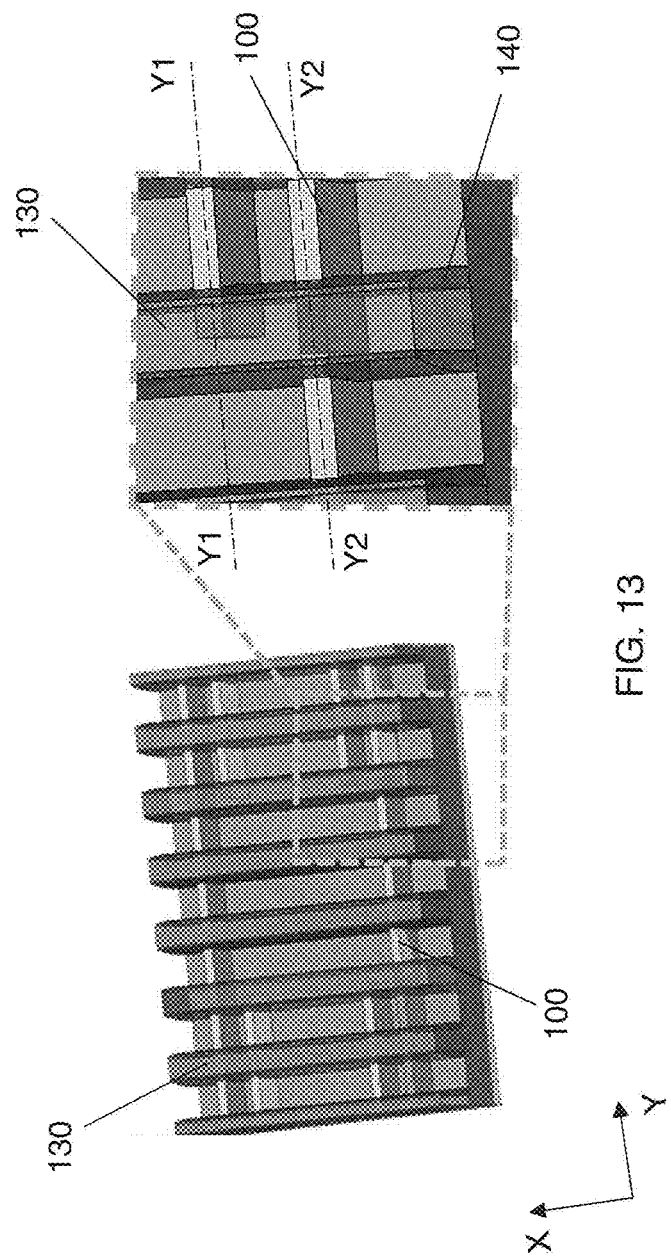
FIG. 13 shows a perspective view of one of the various stages of a sequential manufacturing operation of a semiconductor device according to an embodiment of the present disclosure.

FIG. 13 shows a perspective view of the structure after the dummy gate electrodes 130 are divided. In some embodiments, part of the dummy gate electrodes 130 and part of the fin structures 100 are removed. In some embodiments, edge portions of the fin structure are removed together with the dummy gate electrode disposed thereabove (fin-end gate cut operation). Further, one or more fin structures 100 are divided to form electrically separated fin structures for multiple FinFETs.

FIGS. 14A-15B show a fin-end gate cut process according to an embodiment of the present disclosure. FIG. 14A shows a cross sectional view corresponding to line Y1-Y1 of FIG. 13 and FIG. 14B shows a cross sectional view corresponding to line Y2-Y2 of FIG. 13. In some embodiments, an additional ILD layer 155 is formed over the ILD layer 150. Further, a mask layer 170 having an opening 175 is formed over the additional ILD layer 155, as shown in FIGS. 14A and 14B in some embodiments. By using the mask layer 170 as an etching mask, the ILD layers 150, 155, the dummy gate electrode 130, the dummy gate dielectric layer 120, the isolation insulating layer 100 (FIG. 14A) and the fin structure 100 are etched to form a trench or groove, and the trench or groove is filled with a dielectric material 180, such as SiN, SiCN, SiON or SiOCN, as shown in FIGS. 15A and 15B. One or more layers of different dielectric materials are used as the dielectric material 180 in some embodiments. In some embodiments, after the trench or groove is filled by the dielectric material, a planarization operation such as a CMP process is performed to expose the upper surface of the dummy gate electrode 130, as shown in FIGS. 15A and 15B. In other words, the dummy gate electrodes 130 function as a stopper for the CMP process.

After the planarization operation to expose the dummy gate electrodes 130, the dummy gate electrodes 130 and dummy gate insulating layer 120 are removed by using suitable dry etching and/or wet etching techniques, thereby forming gate openings. Then, metal gate structures including a gate dielectric layer and a metal gate electrode layer are formed. In certain embodiments, the gate dielectric layer includes one or more layers of dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The metal gate electrode layer includes any suitable material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

In certain embodiments, one or more work function adjustment layers are also disposed between the gate dielectric layer and the metal gate electrode layer. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For an n-channel FET, one or more of TaN, TaAlC, TiN, TiC, Co, TiAl, HfTi, TiSi and TaSi is used as the work function adjustment layer, and for an p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel Fin FET and the p-channel Fin FET, which may use different metal layers.

In forming the metal gate structures, the gate dielectric layer, the work function adjustment layer and the gate electrode layer are formed by a suitable film forming method, for example, CVD or ALD for gate dielectric layer, and CVD, PVD, ALD or electroplating for the metal layers, and then a planarization operation such as CMP is performed.

It is understood that the structure after the metal gate electrode is formed undergoes further CMOS processes to form various features such as interconnect vias, interconnect metal layers, passivation layers, etc.

FIG. 16 shows a layout pattern for active regions according to an embodiment of the present disclosure. In embodiments of the present disclosure, the layout pattern is for a logic circuit, which is not a memory cell such as a static random access memory cell, not dummy structures that do not function as functional circuitry, not an input/output circuit and not patterns/structures used for the purpose of semiconductor fabrication process (e.g., alignment marks)). In planar FET devices, an active region is a surface region, which is generally flat, of a semiconductor substrate, and includes a channel region, a source region and a drain region (source/drain regions). Depending on electrical property requirements, the active regions, in particular the channel regions, have different widths (along the direction parallel to the gate extending direction). In FinFETs, depending on electrical property requirements, the active regions include different numbers of fin structures. For example, in FIG. 16, the active region 212 includes one fin structure, while the active region 214 includes two fin structures.

In FIG. 16, the active region formed by regions 212 and 214 has an L-shape, while the active region 216 has a rectangular shape. In some embodiments, the layout pattern includes a T-shape active region.

FIG. 17 shows a mandrel (dummy) pattern and the layout pattern for active regions according to an embodiment of the present disclosure. As set forth above, a pair of fin structures are formed around the periphery of the mandrel pattern 220. Thus, the mandrel pattern 220 is placed as shown in FIG. 17, such that the vertical edge line (Y direction) of the mandrel pattern 220 is located at or near the center of the active regions having two fins (e.g., 214 or 216).

FIGS. 18 and 19 show fin structures and the layout pattern for active regions according to an embodiment of the present disclosure. By the manufacturing operations as set forth above, fin structures 230 are formed. FIG. 18 shows relative locations of the fin structures 230 and the layout of active regions 210. Further, as shown in FIG. 19, unnecessary portions of the fin structures 230 are removed to obtain desired fin structures corresponding to the layout active regions 210.

To remove the unnecessary portions of the fin structures 230, two patterning operations are performed in some embodiments. In one embodiment, as shown in FIGS. 20 and 21, by using a first mask pattern 240, portions of the fin structures 230 generally extending in the Y direction are removed (photo-etching process), and then by using a second mask pattern 250, portions of the fin structures 230 removed or cut. In other embodiments, as shown in FIGS. 22 and 23, by using a first mask pattern 245, portions of the fin structures 230 generally extending in the Y direction are removed (photo-etching process), and then by using a second mask pattern 255, portions of the fin structures 230 are removed or cut. In the embodiment of FIGS. 20 and 21, the first mask pattern 240 is not rectangular (as designed on a layout) and includes a protrusion, and in the embodiment of FIGS. 22 and 23, the second mask pattern 255 is not rectangular and includes a protrusion. In some embodiments, the mask patterns include indentations (concave portions). In both embodiments, a small pattern to cut one fin structure is included in the second mask pattern. When the pattern size to be printed by a lithography process approaches the resolution limit of lithography equipment, the protrusions, indentations and/or small patterns may not be printed as desired.

In some embodiments of the present disclosure, the first and/or second mask patterns used to remove or cut the fin structures according to the layout of the active regions include only rectangular patterns (as designed). In certain embodiments, the first and/or second mask patterns include only rectangular patterns (as designed) having a dimension equal to or greater than a threshold value. In some embodiments, the first and/or second mask patterns include no pattern to cut only one fin structure. In certain embodiments, no photo-etching operation using the second mask pattern is performed.

To achieve this, in some embodiments of the present disclosure, one or more dummy active regions are added to the original layout of the active regions. FIG. 24 shows a layout pattern for active regions after dummy active region patterns are added. The dummy active region patterns are added such that all the first mask pattern (first fin-cut pattern)

become rectangular. In some embodiments, dummy active regions 213 and 215 are added to make the active region patterns symmetric.

FIG. 25 shows a mandrel (dummy) pattern and the layout pattern for active regions, similar to FIG. 17.

By the manufacturing operations as set forth above, fin structures 230 are formed. FIG. 26 shows relative locations of the fin structures 230 and the layout of active regions 210 with the dummy active regions. Further, as shown in FIG. 27, unnecessary portions of the fin structures 230 are removed to obtain desired fin structures corresponding to the layout active regions 210. As shown in FIG. 27, a rectangular mask pattern 260 is used to cur the unnecessary portions of the fin structure 230.

As shown in FIG. 28, portions 235 of the fin structures need to be removed or electrically isolated from the remaining fin structures (active fin structures) in some embodiments. FIGS. 29-34 show how to electrically isolate the portions 235 shown in FIG. 28 according to an embodiment of the present disclosure.

FIG. 29 shows a layout of gate patterns 270 (dummy gate patterns) and a layout pattern for active regions 210 according to an embodiment of the present disclosure. The layout further shows fin-end gate cut patterns 280 (see, FIGS. 13-15B).

FIG. 30 shows the layout of gate patterns 270 and the layout pattern for active regions after dummy active region patterns 213, 215 are added.

Further, as shown in FIG. 31, one or more additional fin-end gate cut patterns 285 are added to the layout. In view of the unnecessary fin structures 235 as shown in FIG. 28, the locations of the additional fin-end gate cut patterns 285 are determined in some embodiments.

FIG. 32 shows a top view after dummy gate structures 300 are formed over the fin structures 230. The dummy gate structures 300 are formed by the operations as set forth above, and include a dummy gate dielectric layer, dummy gate electrode, and gate sidewall spacers in some embodiments.

By the operations explained with FIG. 13-15B, the dummy gate electrode, the dummy gate dielectric layer, the isolation insulating layer and the fin structure are etched to form trenches or grooves, as shown in FIG. 33 and the trenches or grooves are filled with dielectric material 310 as shown in FIG. 34. The unnecessary fin structures 235 are electrically separated from other fin structures (i.e., active fin structures used for active FinFETs) by the dielectric material 310.

In some embodiments, the second mask pattern to cut the fin structures is replaced with additional fin-end gate cut patterns.

Figure 35:
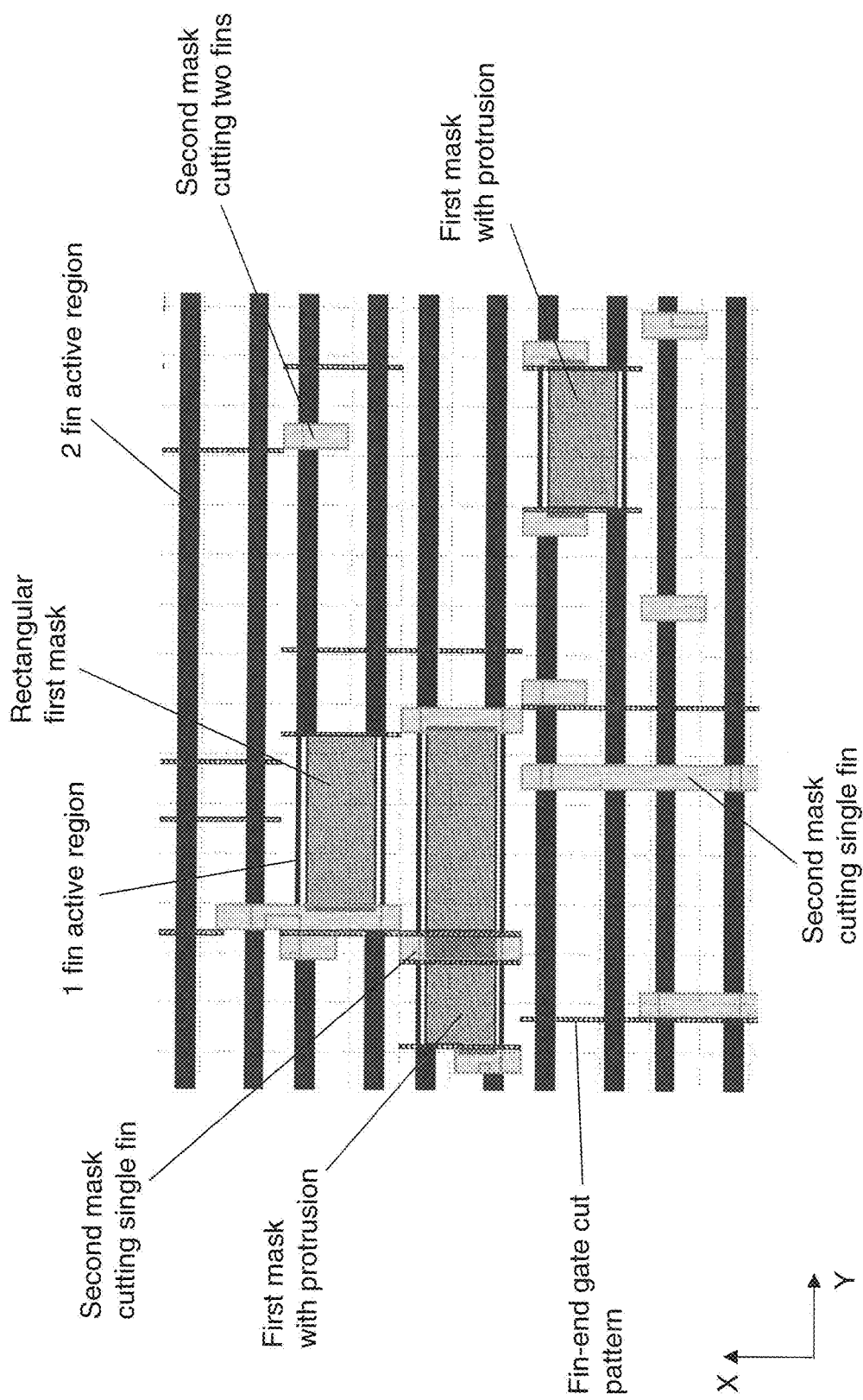
FIG. 35 shows an original layout including active regions, first mask patterns, second mask patterns and fin-end gate cut patterns according to an embodiment of the present disclosure.
Figure 36:
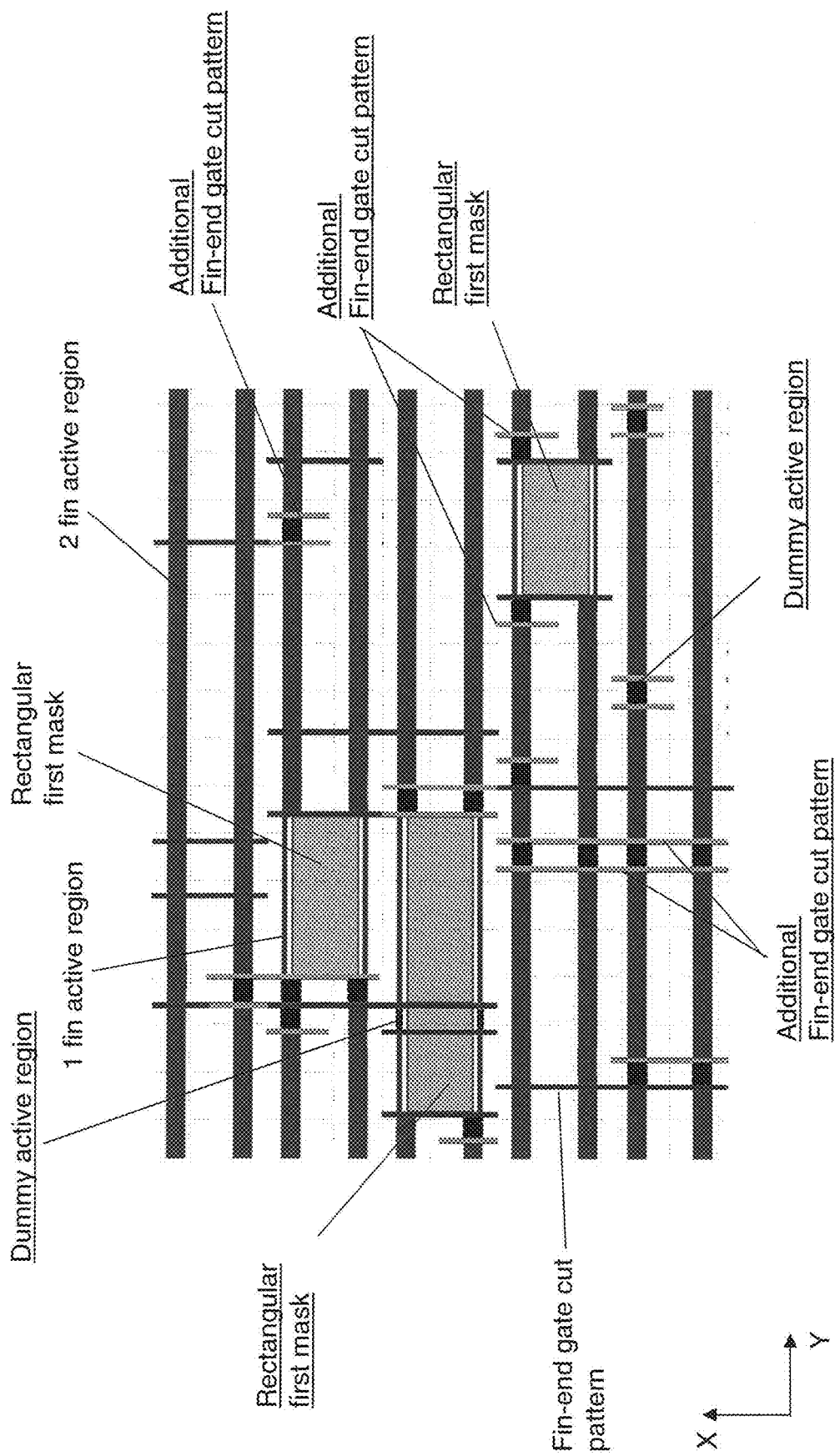
FIG. 36 shows a layout including dummy active regions and additional fin-end gate cut patterns according to an embodiment of the present disclosure.

FIGS. 35 and 36 show another embodiment of the present disclosure. FIG. 35 shows an original layout including active regions, first mask patterns, second mask patterns and fin-end gate cut patterns. In FIG. 35, two first mask patterns include protrusions.

FIG. 36 shows a layout after dummy active regions and additional fin-end gate cut patterns are generated. In some embodiments, the second mask patterns are replaced with dummy active regions and additional fin-end gate cut patterns. The additional fin-end gate cut patterns are generated along the edges of the second mask patterns along the Y direction in some embodiments. The dummy active regions are added to connect the adjacent active regions otherwise divided by the second mask patterns in some embodiments. In some embodiments, the width of the dummy active regions is equal to a width of two-fin active regions and/or a width of a one-fin active region. Further, the first mask patterns with protrusions are reshaped to rectangular patterns in some embodiments.

In some embodiments, the second mask pattern is used to cut end portions along the Y direction (short sides and corners of the ring (or framed) shaped fin structures). In certain embodiments, no pattern is included in logic circuit regions in the second mask pattern. In such a case, the second mask patterns have a rectangular shape extending along the X direction. In some embodiments, the end portions along the Y direction of the fin structures are cut or removed by the first mask pattern together with the part of the long sides of the ring (or framed) shaped fin structures.

In the foregoing embodiments, by adding dummy active region patterns, it is possible to avoid non-rectangular patterns, which generally are difficult to pattern, in fin-cut patterns, and to realize the fin-cut patterns having only rectangular patterns. Further, by adding additional fin-end gate cut patterns, it is possible to electrically separate unnecessary fin structures (dummy fin structures) from active fin structures.

It will be understood that not all advantages have been necessarily discussed herein, no particular advantage is required for all embodiments or examples, and other embodiments or examples may offer different advantages.

In accordance with an aspect of the present disclosure, in a method of manufacturing a semiconductor device, a layout is prepared. The layout includes active region patterns, each of the active region patterns corresponding to one or two fin structures, first fin cut patterns and second fin cut patterns. At least one pattern selected from the group consisting of the first fin cut patterns and the second fin cut patterns has a non-rectangular shape. The layout is modified by adding one or more dummy active region patterns and by changing the at least one pattern to be a rectangular pattern. Base fin structures are formed according to a modified layout including the active region patterns and the dummy active region patterns. Part of the base fin structures is removed according to one of a modified layout of the first fin cut patterns and a modified layout of the second fin cut patterns, in which the at least one pattern has been changed to be the rectangular pattern. In one or more of the foregoing or the following embodiments, the first fin cut patterns includes the at last one pattern, and further include patterns having a non-rectangular shape, and all patterns having a non-rectangular shape of the first fin cut patterns are changed to a rectangular shape. In one or more of the foregoing or the following embodiments, the second mask patterns include no non-rectangular pattern. In one or more of the foregoing or the following embodiments, the method further includes generating a mandrel pattern based on the active region pattern and dummy active region pattern, and the base fin structures include a pair of ring shaped fin structures corresponding to a periphery of the mandrel pattern. In one or more of the foregoing or the following embodiments, each of the pair of ring shaped fin structures has a longer side extending in a first direction and a shorter side extending in a second direction crossing the first direction, and in the removing part of the base fin structures, an etching mask pattern corresponding to the first mask patterns is used to remove part of the longer side of the pair of ring shaped fin structures. In one or more of the foregoing or the following embodiments, no part of the shorter sides of the pair of ring shaped fin structures is removed by the etching mask pattern corresponding to the first mask patterns. In one or more of the foregoing or the following embodiments, part of the base fin structures is further cut according to the second fin cut patterns. In one or more of the foregoing or the following embodiments, in the cutting the part of the base fin structures, an etching mask pattern corresponding to the second mask patterns is used to remove part of the shorter side of the pair of ring shaped fin structures. In one or more of the foregoing or the following embodiments, corners of the pair of ring shaped fin structures are removed by using the etching mask pattern corresponding to the second mask patterns. In one or more of the foregoing or the following embodiments, a part of one of the pair of fin structures is removed by using the etching mask pattern corresponding to the first mask patterns In accordance with another aspect of the present disclosure, in a method of manufacturing a semiconductor device, a layout is prepared. The layout includes active region patterns, each of the active region patterns corresponding to one or two fin structures, first fin cut patterns, second fin cut patterns and fin-end gate cut patterns. At least one pattern of the first fin cut patterns has a non-rectangular shape. The layout is modified by adding one or more dummy active region patterns, by changing the at least one pattern to be a rectangular pattern and by adding one or more additional fin-end gate cut patterns. Base fin structures are formed according to a modified layout including the active region patterns and the dummy active region patterns. Part of the base fin structures is removed according to a modified layout of the first fin cut patterns, in which the at least one pattern has been changed to be the rectangular pattern, thereby forming fin structures. Dummy gate structures are formed. Part of the dummy gate structures and the fin structures are removed using an etching mask corresponding to a modified layout including the fin-end gate cut patterns and the additional fin-end gate cut patterns, thereby forming one or more grooves. In one or more of the foregoing or the following embodiments, the additional fin-end gate cut patterns correspond to longitudinal edges of the second fin cut patterns. In one or more of the foregoing or the following embodiments, after the additional fin-end gate cut patterns are generated, the second fin cut patterns are removed from the layout. In one or more of the foregoing or the following embodiments, each of the dummy active region patterns are directly adjacent to two additional fin-end gate cut patterns or one additional fin-end gate cut pattern and one fin-end gate cut pattern. In one or more of the foregoing or the following embodiments, the one or more grooves are filled with one or more dielectric materials. In one or more of the foregoing or the following embodiments, the method further includes generating a mandrel pattern based on the active region pattern and dummy active region pattern, and the base fin structures includes a pair of ring shaped fin structures corresponding to a periphery of the mandrel pattern. In one or more of the foregoing or the following embodiments, each of the pair of ring shaped fin structures has a longer side extending in a first direction and a shorter side extending in a second direction crossing the first direction, and in the removing part of the base fin structures, an etching mask pattern corresponding to the first mask patterns is used to remove part of the longer side of the pair of ring shaped fin structures. In one or more of the foregoing or the following embodiments, no part of the shorter sides of the pair of ring shaped fin structures is removed by the etching mask pattern corresponding to the first mask patterns. In one or more of the foregoing or the following embodiments, the shorter sides of the pair of ring shaped fin structures is removed by the etching mask pattern corresponding to the first mask patterns.

In accordance with another aspect of the present disclosure, a semiconductor device including fin field effect transistors includes a plurality of active fin structures disposed over on a substrate, a dummy fin structures, and two fin separation dielectric layers. The dummy fin structure is adjacent to one of the plurality of active fin structures with one of the two fin separation dielectric layers interposed and to another of the plurality of active fin structures with another of the two fin separation dielectric layers interposed.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
preparing a layout comprising active region patterns, each of the active region patterns corresponding to one or two fin structures, first fin cut patterns and second fin cut patterns, wherein at least one pattern selected from the group consisting of the first fin cut patterns and the second fin cut patterns has a non-rectangular shape;
modifying the layout by adding one or more dummy active region patterns and by changing the at least one pattern to be a rectangular pattern;
forming base fin structures according to a modified layout including the active region patterns and the dummy active region patterns; and
removing part of the base fin structures according to one of a modified layout of the first fin cut patterns and a modified layout of the second fin cut patterns in which the at least one pattern has been changed to be the rectangular pattern.

2. The method of claim 1, wherein:
the first fin cut patterns includes the at last one pattern, and further include patterns having a non-rectangular shape, and
the method comprises changing all patterns having a non-rectangular shape of the first fin cut patterns to a rectangular shape.

3. The method of claim 2, wherein the second mask patterns include no non-rectangular pattern.

4. The method of claim 2, further comprising:
generating a mandrel pattern based on the active region pattern and dummy active region pattern,
wherein the base fin structures includes a pair of ring shaped fin structures corresponding to a periphery of the mandrel pattern.

5. The method of claim 4, wherein:
each of the pair of ring shaped fin structures has a longer side extending in a first direction and a shorter side extending in a second direction crossing the first direction, and
in the removing part of the base fin structures, an etching mask pattern corresponding to the first mask patterns is used to remove part of the longer side of the pair of ring shaped fin structures.

6. The method of claim 5, wherein no part of the shorter sides of the pair of ring shaped fin structures is removed by the etching mask pattern corresponding to the first mask patterns.

7. The method of claim 5, further comprising cutting part of the base fin structures according to the second fin cut patterns.

8. The method of claim 7, wherein in the cutting the part of the base fin structures, an etching mask pattern corresponding to the second mask patterns is used to remove part of the shorter side of the pair of ring shaped fin structures.

9. The method of claim 8, wherein corners of the pair of ring shaped fin structures are removed by using the etching mask pattern corresponding to the second mask patterns.

10. The method of claim 5, wherein a part of one of the pair of fin structures is removed by using the etching mask pattern corresponding to the first mask patterns.

11. A method of manufacturing a semiconductor device, comprising:
preparing a layout comprising active region patterns, each of the active region patterns corresponding to one or two fin structures, first fin cut patterns, second fin cut patterns and fin-end gate cut patterns, wherein at least one pattern of the first fin cut patterns has a non-rectangular shape;
modifying the layout by adding one or more dummy active region patterns, by changing the at least one pattern to be a rectangular pattern and by adding one or more additional fin-end gate cut patterns;
forming base fin structures according to a modified layout including the active region patterns and the dummy active region patterns;
removing part of the base fin structures according to a modified layout of the first fin cut patterns, in which the at least one pattern has been changed to be the rectangular pattern, thereby forming fin structures;
forming dummy gate structures; and
removing part of the dummy gate structures and the fin structures using an etching mask corresponding to a modified layout including the fin-end gate cut patterns and the additional fin-end gate cut patterns, thereby forming one or more grooves.

12. The method of claim 11, wherein the additional fin-end gate cut patterns correspond to longitudinal edges of the second fin cut patterns.

13. The method of claim 12, wherein after the additional fin-end gate cut patterns are generated, the second fin cut patterns are removed from the layout.

14. The method of claim 11, wherein each of the dummy active region patterns are directly adjacent to two additional fin-end gate cut patterns or one additional fin-end gate cut pattern and one fin-end gate cut pattern.

15. The method of claim 11, further comprising filling the one or more grooves with one or more dielectric materials.

16. The method of claim 11, wherein:
the layout further comprises a mandrel pattern generated based on the active region pattern and dummy active region pattern, and
the base fin structures includes a pair of ring shaped fin structures corresponding to a periphery of the mandrel pattern.

17. The method of claim 16, wherein:
each of the pair of ring shaped fin structures has a longer side extending in a first direction and a shorter side extending in a second direction crossing the first direction, and
in the removing part of the base fin structures, an etching mask pattern corresponding to the first mask patterns is used to remove part of the longer side of the pair of ring shaped fin structures.

18. The method of claim 17, wherein no part of the shorter sides of the pair of ring shaped fin structures is removed by the etching mask pattern corresponding to the first mask patterns.

19. The method of claim 17, wherein the shorter sides of the pair of ring shaped fin structures are removed by the etching mask pattern corresponding to the first mask patterns.

20. A method of manufacturing a semiconductor device, comprising:
preparing a layout comprising active region patterns, each of the active region patterns corresponding to one or two fin structures, first fin cut patterns and second fin cut patterns, wherein at least one pattern selected from the group consisting of the first fin cut patterns and the second fin cut patterns has a non-rectangular shape;
modifying the layout by adding one or more dummy active region patterns and by changing the at least one pattern to be a rectangular pattern;
preparing photo masks based on the modified layout;
forming base fin structures using at least one of the photo masks, which correspond to the active region patterns and the dummy active region patterns; and
removing part of the base fin structures using at least one of the photo masks, which corresponds to the first fin cut patterns and the second fin cut patterns in which the at least one pattern has been changed to be the rectangular pattern.

* * * * *